USO05585794A

United States Patent [19]
Airoldi et al.

[11] Patent Number: 5,585,794
[45] Date of Patent: Dec. 17, 1996

[54] ELECTRONIC DEVICE FOR THE AUTOMATIC CONVERSION OF SAMPLED FREQUENCIES

[75] Inventors: Fabrizio Airoldi, Feriolo di Baveno; Alessandro Cremonesi, Sant'Angelo Lodigiano, both of Italy

[73] Assignee: SGS-Thomson Microelectronics, S.r.l., Agrate Brianza, Italy

[21] Appl. No.: 224,673

[22] Filed: Apr. 7, 1994

Related U.S. Application Data

[63] Continuation-in-part of Ser. No. 990,043, Dec. 14, 1992, abandoned.

[30] Foreign Application Priority Data

Dec. 13, 1991 [IT] Italy .................................. MI91A3348

[51] Int. Cl.6 ..................................................... H03M 7/00
[52] U.S. Cl. ........................................... 341/61; 364/724.1
[58] Field of Search ........................... 341/61; 364/724.1, 364/724.11

[56] References Cited

U.S. PATENT DOCUMENTS

| | | | |
|---|---|---|---|
| 4,612,573 | 9/1986 | Grallert et al. | 341/61 |
| 4,797,845 | 1/1989 | Stikvoort | 364/724.1 |
| 4,825,398 | 4/1989 | Koch et al. | 364/724.1 |
| 4,870,661 | 9/1989 | Yamada et al. | 341/61 |
| 4,953,117 | 8/1990 | Lagadec | 364/724.1 |
| 4,954,824 | 9/1990 | Yamada et al. | 341/61 |
| 5,182,633 | 1/1993 | Antonio et al. | 358/11 |

*Primary Examiner*—Howard L. Williams
*Attorney, Agent, or Firm*—David V. Carlson; Clarence T. Tegreene; Seed and Berry LLP

[57] ABSTRACT

An electronic device for the automatic conversion of sampling frequencies, being a type adapted to convert a predetermined frequency of a sampled input signal to a desired frequency of an output signal. The device is comprised of:

a phase detector being input both the input frequency and the output frequency; a decoder block associated with the detector to determine an interpolation coefficient; an interpolation filter having a digital input for encoding the sampling signal and receiving the input frequency on the one side, and a digital signal representative of the interpolation coefficient on the other side; and a synchronizer connected after the filter and being input both said input and output frequencies, the synchronizer having a digital output for encoding the converted sampling signal.

18 Claims, 26 Drawing Sheets

128->7 BITS ENCODER

CONTIN

CONTOUT 5,585,794

ELECTRONIC DEVICE FOR THE AUTOMATIC CONVERSION OF SAMPLED FREQUENCIES

CROSS-REFERENCE TO RELATED APPLICATION

This application is a Continuation-In-Part of U.S. patent application Ser. No. 07/990,043, filed Dec. 14, 1992, application now abandoned.

TECHNICAL FIELD

This invention relates to an electronic device for the automatic conversion of sampling frequencies, being a type adapted to convert a predetermined frequency of a sampled input signal to a desired output signal frequency.

The field of application of this invention is in particular, but not solely, that of the sampling frequency converters used in receiver sets of high resolution television (TV) signals, and the description herein below will make reference to that field of application for convenience of illustration.

BACKGROUND OF THE INVENTION

As is well recognized, high resolution or definition TV sets require that conversions of the video signal sampling frequency be carried out automatically.

TV sets of that type comprise a decoder block for which the sampling frequency is set to a predetermined value which is usually four times the value of the subcarrier frequency Fsc for the television standard adopted, e.g. 17.7 MHz for the European standard known as PAL, and 14.3 MHz for the US standard NTSC.

But, where the TV set operation is more closely tied to the picture geometry, a multiple of the line frequency Mfl=13.5 MHz is used instead. Such is the case, for example, with a line-duplication operating technique, whereby the frequency at which the picture is displayed on the screen is duplicated to avoid the flicker that typically affects ordinary TV sets.

Thus, a frequency conversion becomes necessary between the sampled input video signal, with a sampling frequency $f_{in}$=4 Fsc, and the output signal, with a line sampling frequency $f_{out}$=$M_{fl}$, if best operating conditions are to be ensured for both the decoder and the scan converter block. This conversion is represented in FIG. 1. Where the elements 100, 102, 014, 106 are components of a conventional high resolution television.

This frequency conversion is of vital importance to the video signal processing because a faulty conversion would result in loss of all the benefits of high resolution.

The prior art has proposed a frequency converting method which consists of performing in cascade a double conversion, digital-to-analog and analog-to-digital.

Basically, a signal to be converted, initially sampled at the input sampling frequency $f_{in}$, is first rebuilt by translation from digital into analog by a D/A converter 108. Directly afterwards the analog signal is resampled at the desired output frequency fout by an A/D converter 110 as shown in FIG. 2. However, this known approach has the disadvantage of introducing high distortion in the signal, due to the double conversion.

To overcome this drawback, the prior art has proposed another solution which consists of performing a discrete time operation which is the equivalent of the digital-to-analog and analog-to-digital conversion sequence, using a sampling device. Alternatively, upsampling of the input signal by an upsample 112 followed by downsampling of the upsampled signal by a downsampler 114 may be used, as presented in FIG. 3. This approach has the drawbacks of high frequency clocks relating to the upsampler and great hardware redundancy.

This prior method does prevent the distortion introduced by the analog conversion, but involves the use of a sampling device of considerable complexity circuit-wise and the need to operate at high scanning frequencies.

SUMMARY OF THE INVENTION

An object of this invention is to provide an electronic device having such structural and functional features as to enable automatic conversion of sampling frequencies, to thereby overcome the drawbacks which beset the prior art.

This invention is realized by a device as indicated being characterized in that it comprises a phase detector to which are input both the input and the output sampling frequencies; a decoder block associated with the detector to determine an interpolation coefficient; an interpolation filter having a digital input for encoding the sampled signal and receiving the input frequency, on the one side, and a digital signal representative of said coefficient from an output of the decoder block, on the other side; and a synchronizer, connected after the filter and to which are input both said input and output sampling frequencies, the synchronizer having a digital output for encoding the converted sampled signal.

A digital signal processing approach avoids the great signal distortion due to the sequential D/A and A/D conversion and provides an improved solution. FIG. 4 shows a conceptual architecture for realizing a completely digital sampling frequency conversion. A more detailed architecture of this system is presented in FIG. 5. Note that because the representation of FIG. 4 is an operational presentation, there is not a direct one-to-one correspondence between the elements of FIG. 4 and subsequent figures showing the physical implementation in greater detail.

A linear interpolation produces output data ($Y_{out}$) as the weighted average of two adjacent input data. The linear interpolation algorithm (LIA) gives the $Y_{out}$ value, where the weight coefficient K is A/B, and A is the "instantaneous phase relationship" between the input sampling clock CKIN and output sampling clock CKOUT and B is the period of the input sampling clock.

Note that it is assumed that $f_{in}$>$f_{out}$, such that the SFC implements only downconversion.

The coefficient K is the "instantaneous normalized phase relationship" between the input sampling clock CKIN and the output sampling clock CKOUT.

As described above, the A and B coefficient values are estimated in a phase detector which represents the core of device. The K calculation resulting from the division of A/B allows the linear interpolation algorithm to be implemented in a simple two tap FIR filter. Starting from the factor K, it is easy to extend the LIA to more complicated and sophisticated interpolation algorithms. For example, a Spline interpolator algorithm can be implemented as:

$$Y_{out}=Y_1*K_1+Y_2*K_2+Y_3*K_3+Y_4*K_4$$

where K is the only independent variable and the weighting coefficients $K_i$ are functions of K as discussed hereinafter with reference to FIGS. 22A–B.

Two main SFC features are: (a) implementing the interpolation algorithm (i.e. determining the weight factor K) and (b) synchronization (direct interaction using uncorrelated clocks).

FIG. 4 shows an operational representation of the SFC architecture which realizes the sampling conversion by separating these two different aspects of the conversion. First, the SFC calculates the interpolated data ($Y_{out}$) synchronously with the input clock signal CKIN. Next, it locks processed data to the output clock signal CKOUT completing the conversion operation.

After the phase detector has calculated the A and B value, the K-generator block normalizes A to B, giving the "instantaneous normalized phase relationship" which is the weighting coefficient K. This weighting coefficient is then transferred to the interpolator filter which generates the interpolated samples by averaging the input samples with one of the presented algorithms. Finally, the synchronizer locks the incoming interpolated data which was locked to the input clock signal to the output clock signal CKOUT.

The presence of the control signal CTL may be noticed in FIG. 4. This signal allows two clock rephasing in the synchronizer block to permit locking the interpolated data to the output clock signal CKOUT. FIG. 6 shows the timing of the clocks and the positions of the input and output data samples. Because $T_{out}>T_{in}$, where $T_{out}$ is the period of the output clock signal CKOUT and $T_{in}$ is the period of the input clock signal CKIN, there will occur a period of the input clock signal CKIN in which no rising edge of the output clock signal CKOUT occurs. Such a period is called an "empty interval." This means that, in this period, no output interpolated data must be generated.

The interpolator filter works synchronously with the input clock signal CKIN. Assuming no effect of the control signal CTL, when an empty interval occurs, the interpolator filter averages the sample pair $Y_{i+1}$ and $Y_{i+2}$ (assuming linear interpolation) using the weighting coefficient K which is referred to the past sample ($Y_i$ and $Y_{i+1}$). This operation result is obviously a flawed interpolation. The control signal CTL is generated in order to identify these empty intervals so that the synchronizer can lock only meaningful interpolated data to the output clock signal CKOUT.

The features and advantages of an electronic device according to the invention will be apparent from the following detailed description of an embodiment thereof, given by way of example and not of limitation with reference to the accompanying drawings.

DETAILED DESCRIPTION OF THE INVENTION

Figure 1:
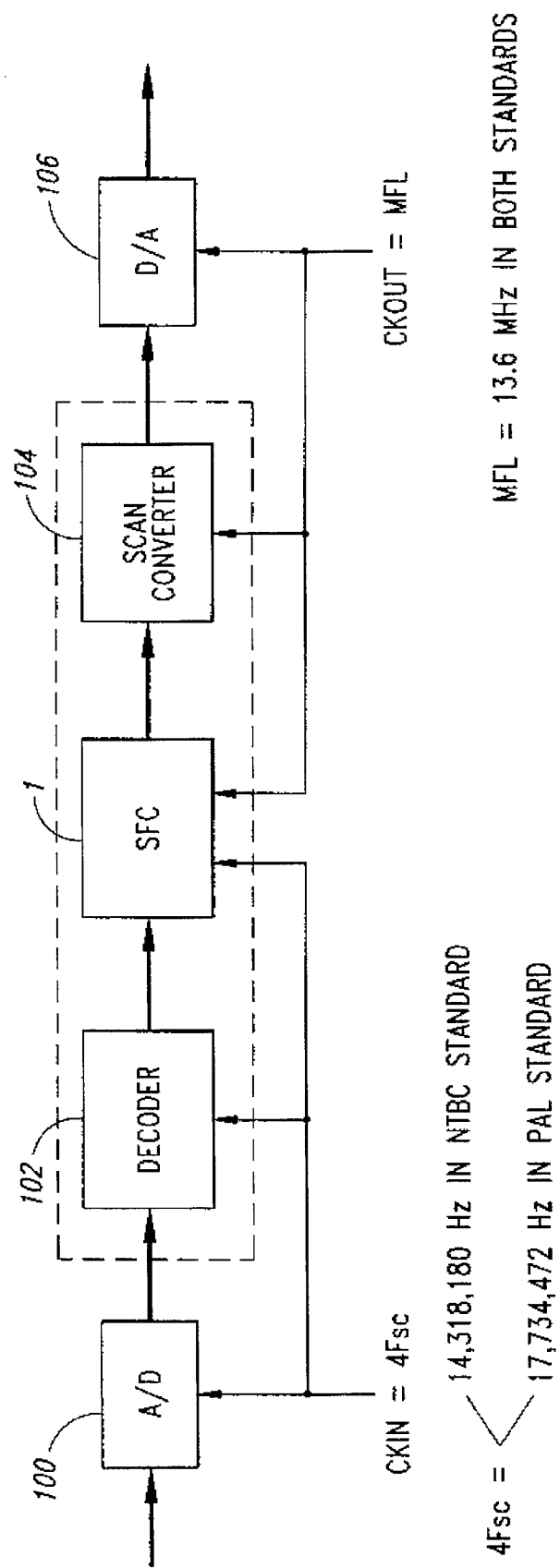
FIG. 1 is a diagrammatic representation of the operation of an embodiment of the invention.
Figure 2:
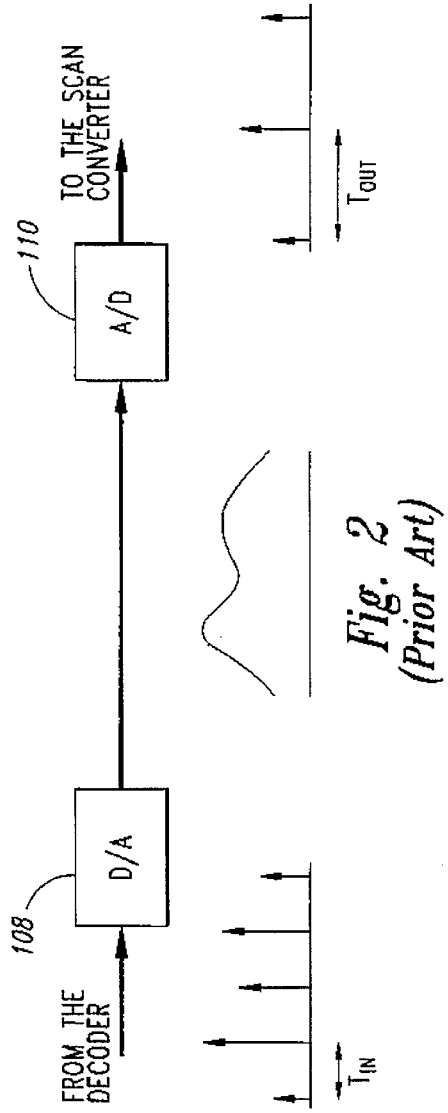
FIG. 2 is a diagrammatic representation of a prior art scanning frequency converter.
Figure 3:
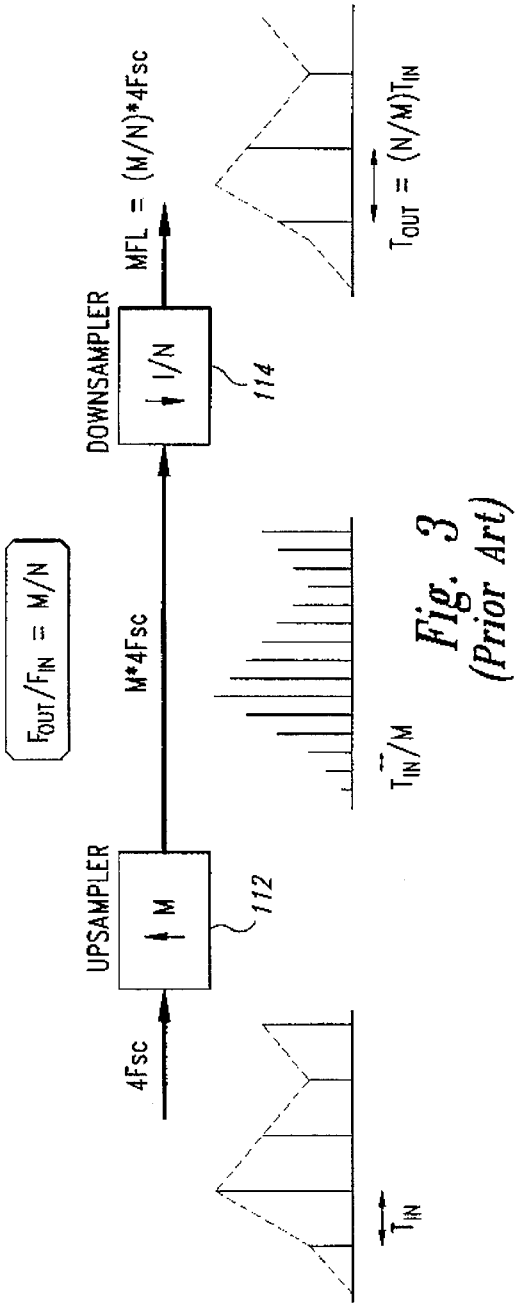
FIG. 3 is a diagrammatic representation of a second prior art scanning frequency converter.
Figure 4:
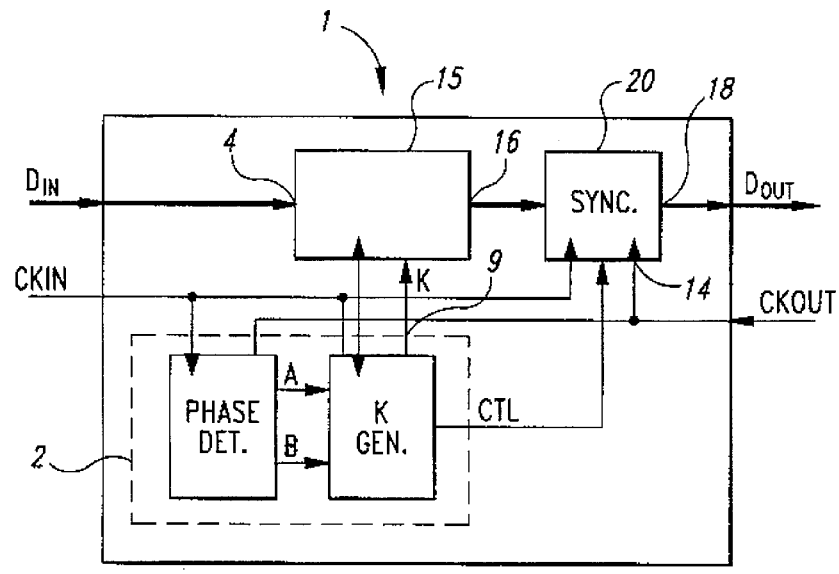
FIG. 4 is a diagrammatic representation of an operational architecture, according to the invention, for converting sampling frequencies automatically.
Figure 6:
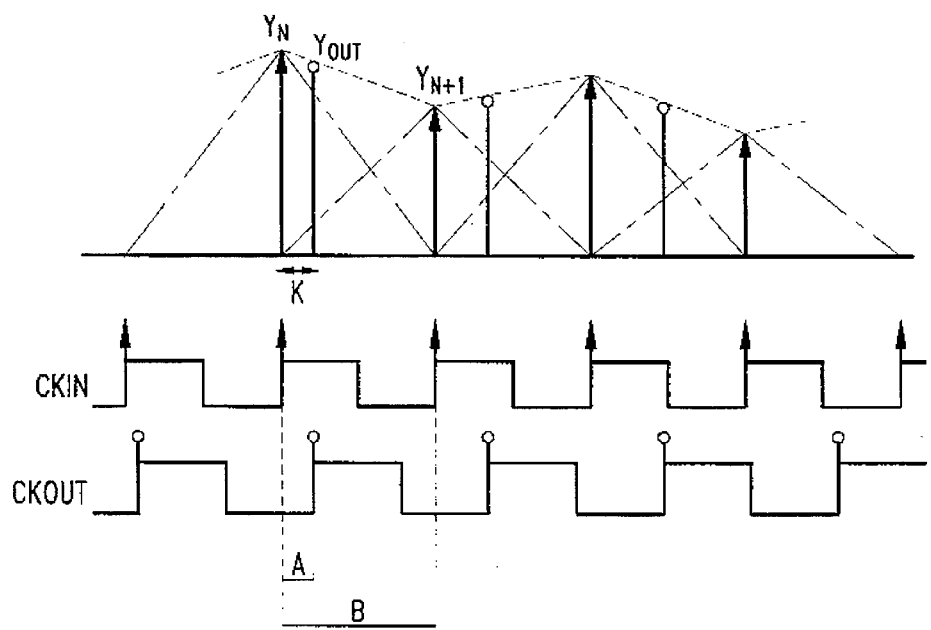
FIG. 6 shows diagrammatically signal waveforms having the same time base and appearing in the device of FIG. 1.
Figure 5:
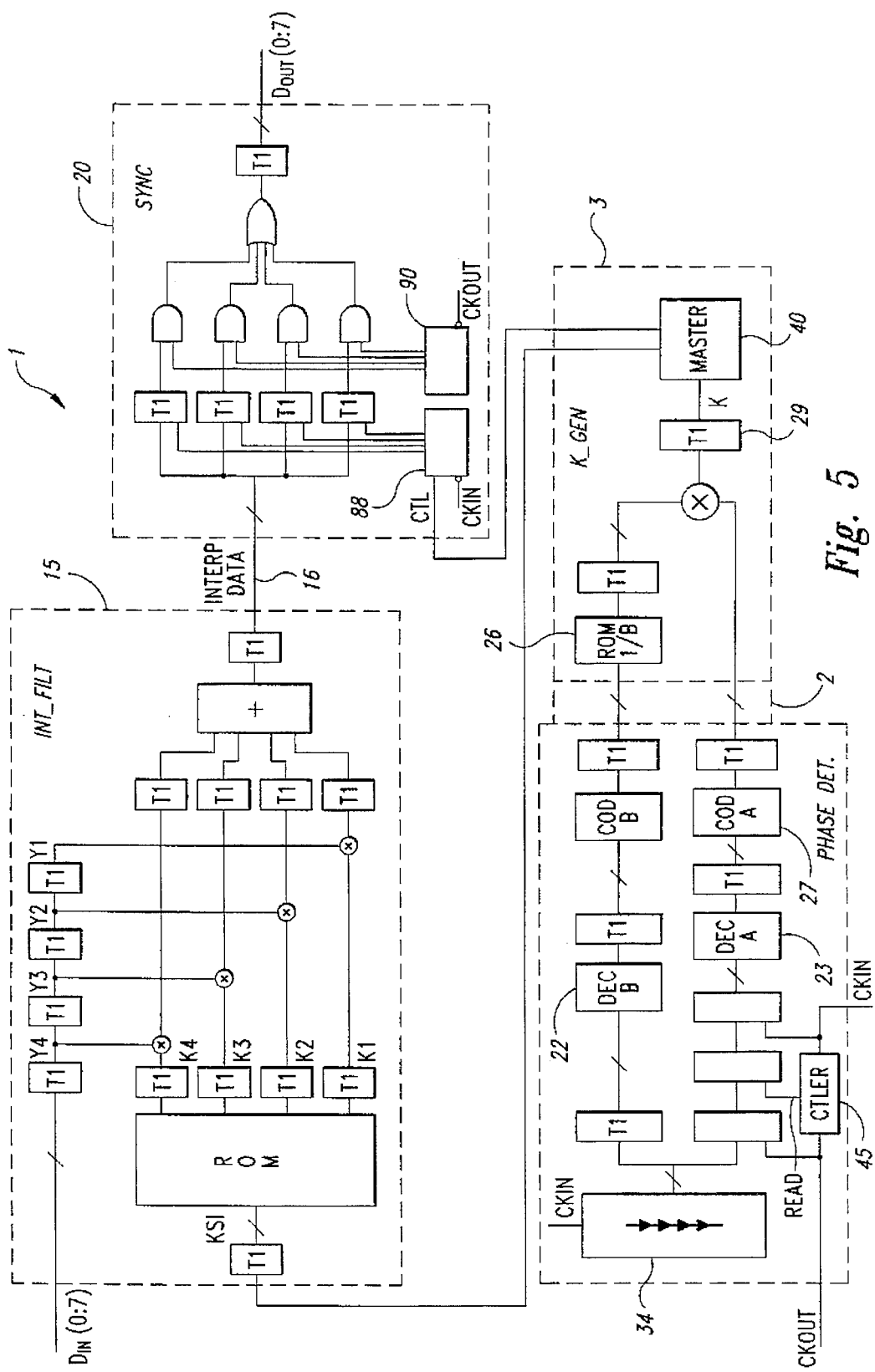
FIG. 5 is a schematic representation of the architecture of the device of FIG. 4.
Figure 7:
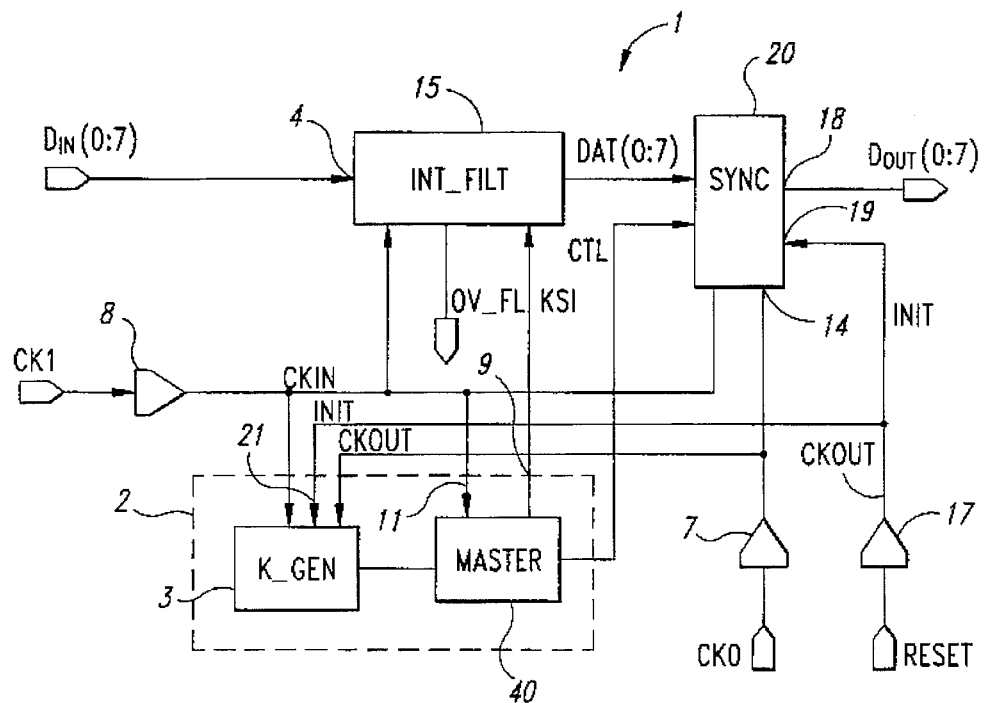
FIG. 7 is a diagrammatic presentation of the device represented operationally in FIG. 4.

With reference to FIG. 7, generally and schematically shown at 1 is an electronic device for the automatic conversion of sampling frequencies, also called a scanning frequency converter (SFC), embodying this invention.

In particular, though not exclusively, the SFC 1 is intended for use in high picture resolution TV sets.

The SFC 1 converts sampled data signal Din provided at an input sampling frequency Fin of an input clock signal CKIN to a sampled data signal Dout being output at a desired sampling frequency Fout of an output clock signal CKOUT.

Figure 8:
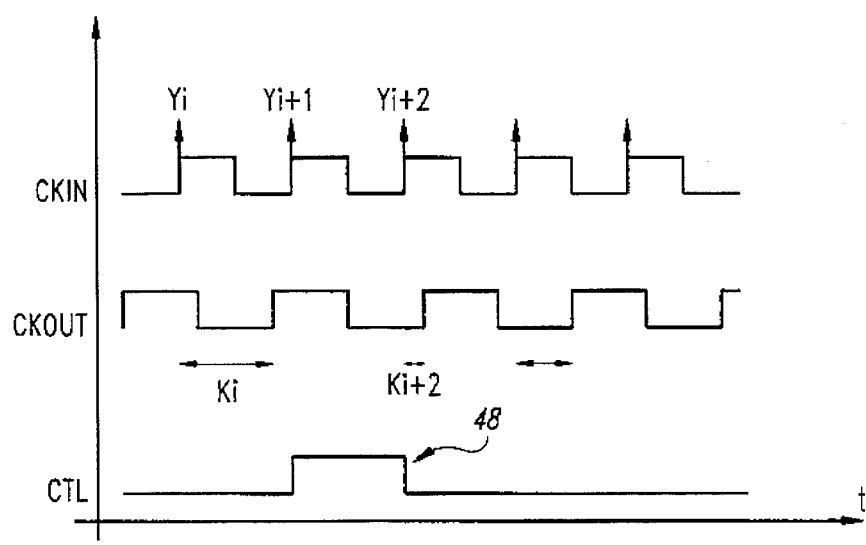
FIG. 8 is a timing diagram presenting the input and output clocks and a control signal of the device of FIG. 5.

The pattern of such sampling clock signals CKIN, CKOUT versus time t is illustrated by the graph in FIG. 8.

It is assumed for this description that the input sampling frequency Fin is at all times higher than the output sampling frequency Fout, so that the device 1 is performing data conversion from a high-frequency clock rate to a lower frequency clock rate (i.e., the SFC 1 performs a down-conversion).

The SFC 1 (FIG. 7) comprises a phase detector 2 (shown in greater detail in FIG. 9) to which is input the clock signal CKIN corresponding to the sampled data signal Din at the frequency Fin via an amplifier 8.

The phase detector 2 also receives, on another input, the clock signal CKOUT at the frequency Fout, transmitted to detector 2 via amplifier 7.

Closely associated with the detector 2 is a decoder block 3 used in determining the interpolation coefficient K quantized in 6 bits.

The decoder block 3 has a six-bit digital bus output 9 and includes a circuit for generating a control signal CTL, as described below.

A master/slave register 40 associated with the phase detector 2 receives, at an input 11, the clock signal CKIN at the sampling frequency Fin and has an output 12 which is connected to an interpolation filter 15. While the interpolation filter of the SFC 1 uses a particular structure which advantageously permits the weighting coefficient K to be updated, as described in greater detail with reference to FIG. 24; however, any well-known interpolation filter structure, realizable by those of ordinary skill in the art is within the scope of the invention. Examples of such filters are shown by "Digital Signal Processing, Theory, Design and Implementation," Chapter 28—*Interpolation Using FIR Filters*, John Wiley & Sons, pp. 79–83. While interpolation filters per se are known, their use in the combination of this invention is not known.

Both the interpolation filter 15 and the synchronizer 20 receive the input clock signal CKIN with a sampling frequency Fin at respective inputs 5 and 6; applied to another input 14 of the synchronizer 20 is also the clock signal CKOUT at sampling frequency Fout.

The interpolation filter 15 is also provided with an eight-pin input 4 receiving an eight-bit digital data signal Din representative of the coding of the sampled signal to be converted frequency-wise, and an eight-pin digital output 16 connected directly to the synchronizer 20. The data signal Din is provided to the input 4 at the input frequency Fin of the input clock signal CKIN. The data signal Dout is output at the output 18 of synchronizer 20 at the new, lower frequency Fout of the output clock signal CKOUT. This invention provides the same data output Dout, or substantially the same data output at the lower clock rate Rout that was provided as the sampled input signal Din at the input 4 at the higher clock rate Fin. Even though the clock rate is lowered, this invention ensures that the data content being output is the same, or substantially the same as the data content being input, with substantially no loss of data.

The interpolation filter 15 is assigned the task of implementing an interpolation algorithm, explained hereinafter, while the synchronizer 20 functions substantially as a storage structure of the FIFO type having a write section driven by the signal at sampling frequency CKIN and a read section driven by the signal at sampling frequency CKOUT, under control by a signal CTL generated by an auxiliary circuit portion as shown and discussed in reference to FIG. 19, which inhibits writing in storage locations whose contents have not been previously read out.

The digital output 18 of the synchronizer 20 comprises eight pins at which the digital coding of the converted signal Dout is output.

For completeness of description, it should be also noted that a reset and enable signal READ is applied, through an amplifier 17, to an input 21 of the detector 2 and to an input 19 of the synchronizer 20.

The operations of the phase detector 2 and the decoder block 3 will now be described in greater detail with reference to the diagrammatic representation of FIG. 9.

The detector 2 comprises a pair of samplers 31, 32 to which are respectively input, the input clock signal CKIN at the input sampling frequency Fin and the output clock signal CKOUT at the output sampling frequency Fout.

The first sampler 31 has an input 33 connected to an output 34A of an analog delay block 34 which, in turn, receives the clock signal CKIN at the input sampling frequency $F_{in}$ at another input 35.

A second output 34B of said delay block 34 is connected input-wise to the second sampler 32, which has its output connected to an input 36 of a sense device 37 operative to provide an estimate of the so-called instant phase relationship, denoted by A hereinafter, between the clock signals CKIN and CKOUT.

Figure 9:
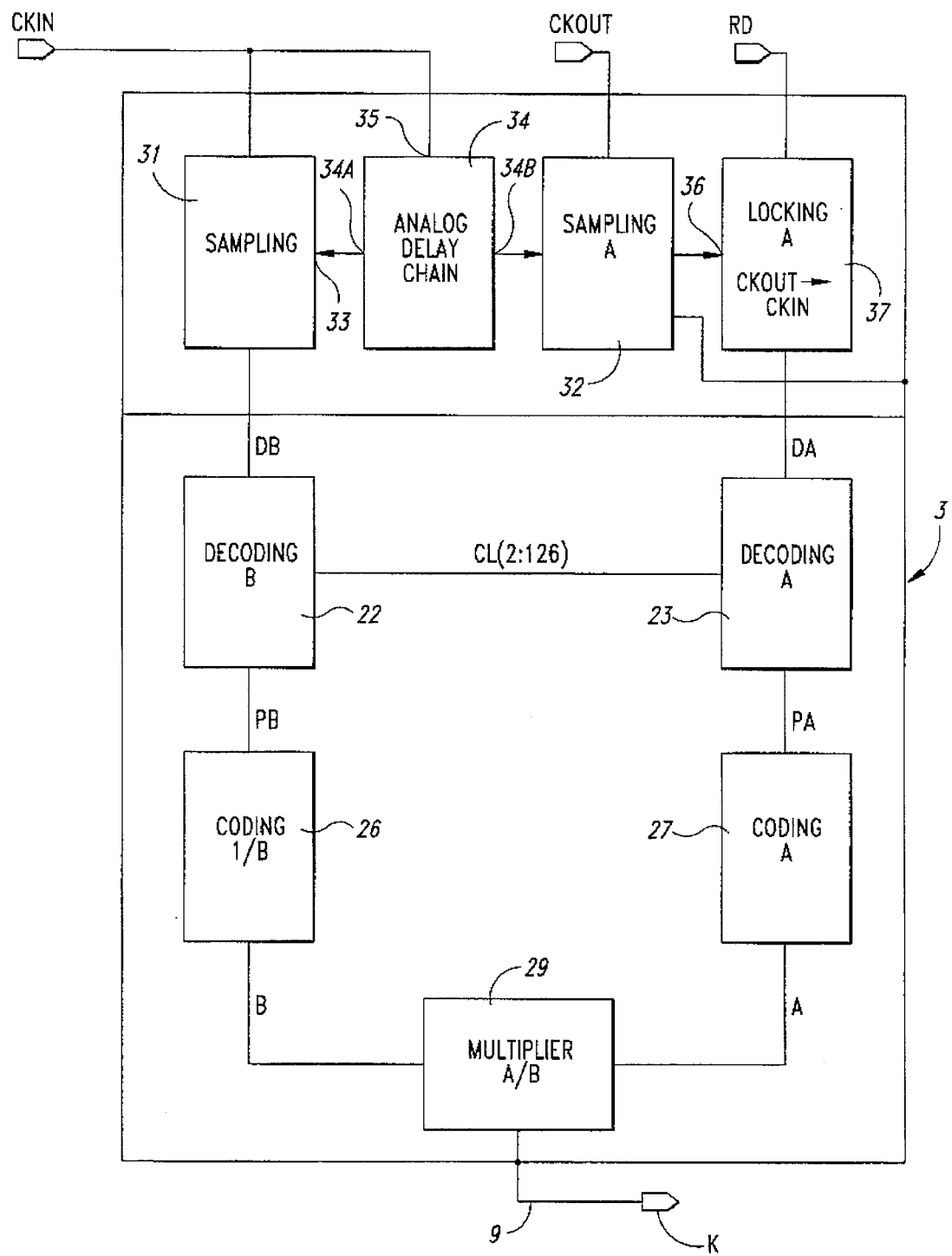
FIG. 9 is a diagrammatic representation of the steps performed by a weighting factor decoding structure within the scanning frequency converter of FIG. 5.

Also shown in FIG. 9 is the decoder block 3 associated with the phase detector 2, which decoder block 3 comprises a pair of decoders 22 and 23, with the former being connected after the first sampler 31, and the latter connected to the output of the sense device 37.

Within the first decoder 22, the value of the period B of the input clock signal CKIN is obtained, while in the second decoder 23, there is obtained the value of the aforesaid instant phase relationship A.

The structure of decoder block 3 is completed by a pair of encoders 26 and 27 respectively connected after the first decoder 22 and the second decoder 23.

The first of said encoders, encoder 26, is for computing the digital coding of the value 1/B, and the other encoder, 27, for carrying out the conversion of the value A into a digital code.

A multiplier 29 is input the respective outputs from the encoders 26 and 27. The output of multiplier 29 is a six-bit digital signal representing an interpolation coefficient K given by the A/B ratio.

Figure 10:
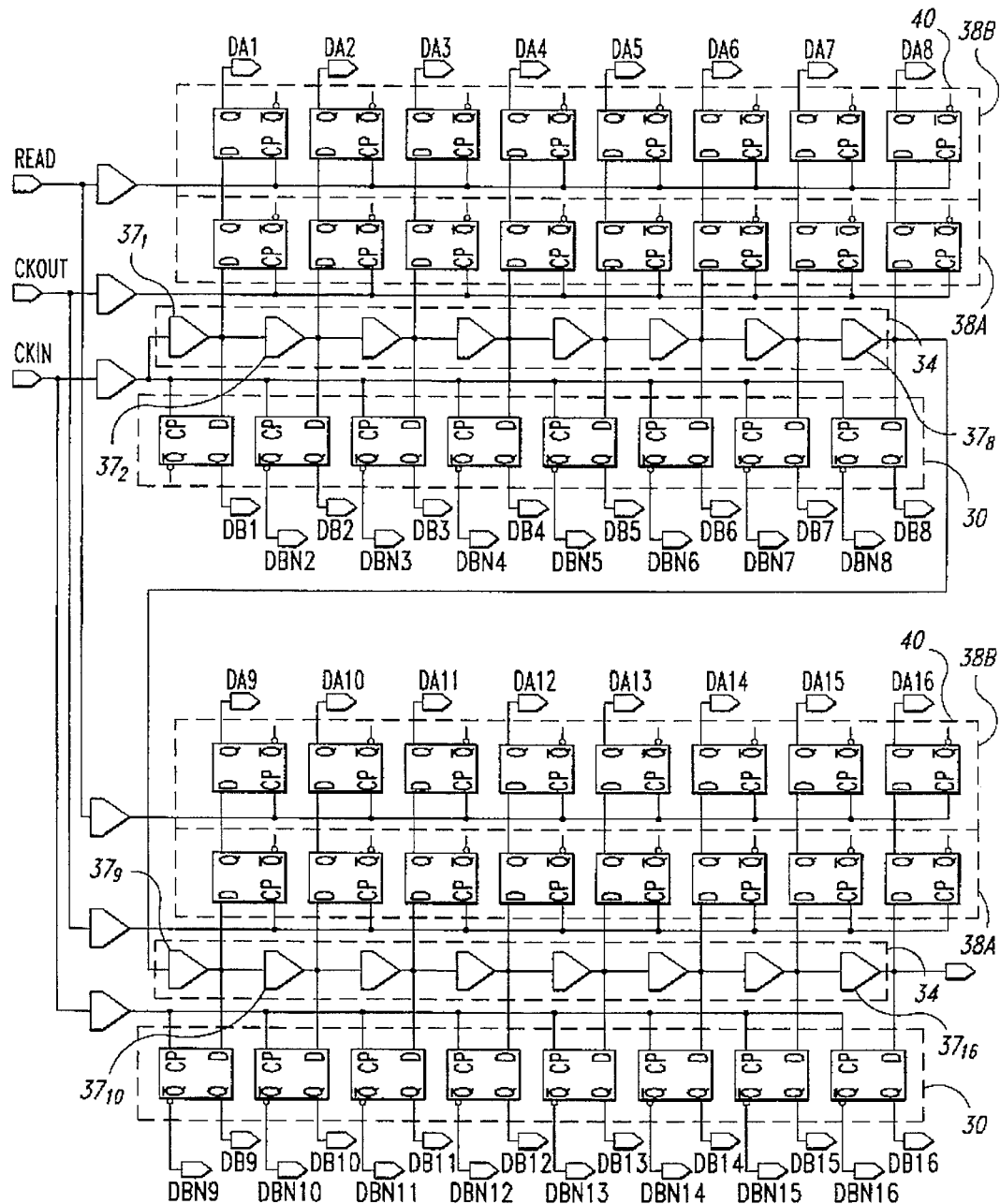
FIG. 10 is a diagrammatic representation of a portion of a phase detector 2 of FIG. 5.
Figure 11:
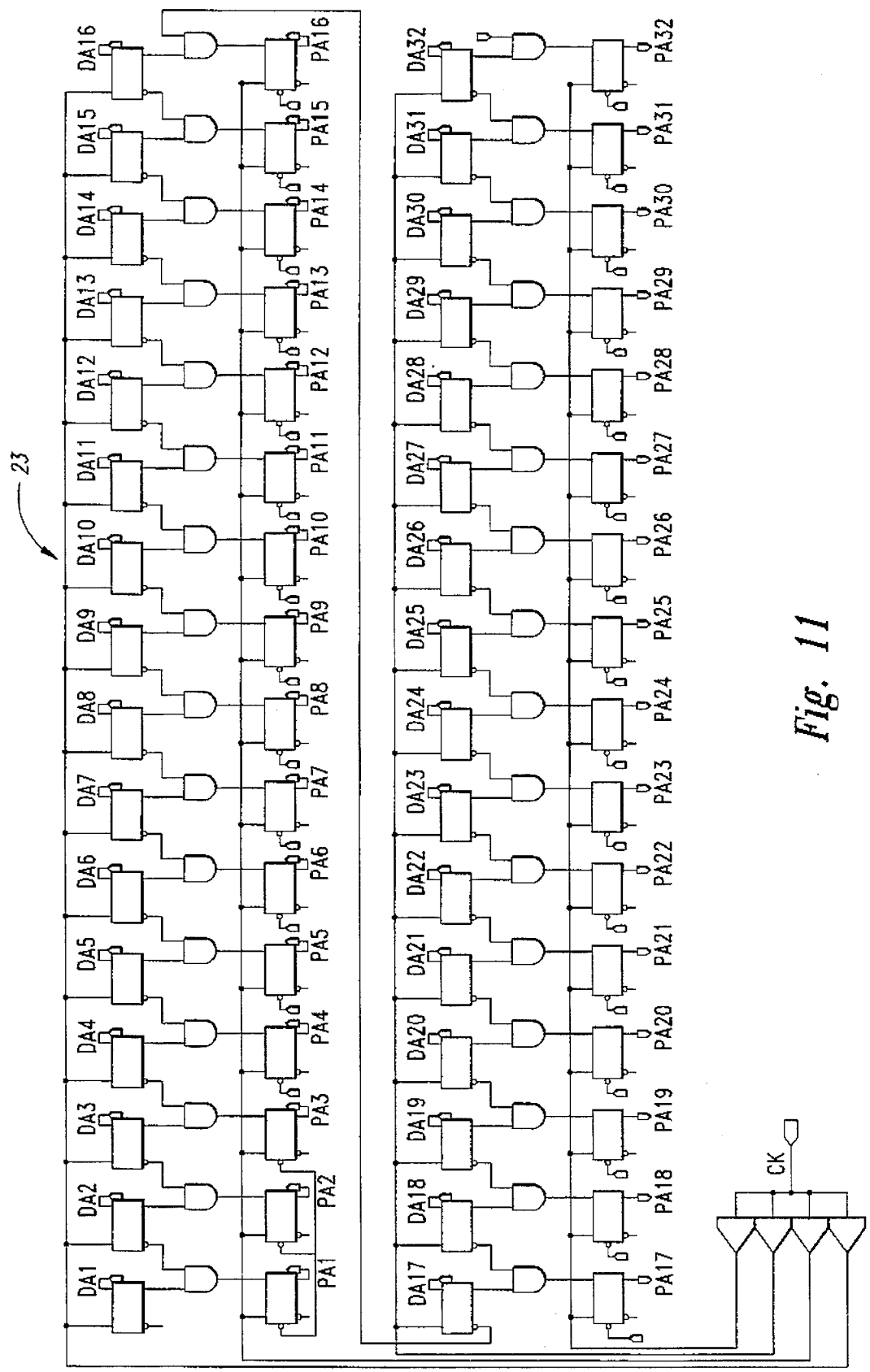
FIG. 11 is a circuit schematic of a portion of the decoder 23 of FIG. 5.

The actual implementation of the phase detector 2 circuit-wise utilizes a 128-bit master/slave register 40 and a 128 element delay chain 34 a portion of each of which is shown in FIG. 10. The master/slave register 40 is effective to constantly monitor the clock signals CKIN and CKOUT. An auxiliary circuit described with respect to FIG. 24 prevents the simultaneous appearance of two rising edges of the signals from hindering the flow of data to the master/slave register 40. The master/slave register 40 includes essentially a first storage portion of the master type and a second portion of the slave type.

Specifically, a first, one hundred and twenty eight-bit register 38A clocked by the rising edge of the output clock signal CKOUT, is connected in parallel with a second, one hundred and twenty eight-bit register 38B which is clocked by the rising edge of the input clock signal CKIN.

Thus, that portion which stores the output from the sampler 32 controlled by the rising edge of the input clock signal CKOUT will be considered to be the master portion 38A.

The input clock signal CKIN, sent to the analog delay chain, is delayed in fixed increments BI by each delay element 37(i). Thus, the input clock signal CKIN available at each delay element output is delayed from the original by the number of delay elements in the chain preceding the current delay element multiplied by the increment BI. The 128 delay element outputs are sampled at every rising edge of the output clock signal CKOUT by the first flip flop group 38A, freezing in the first flip flop group 38A a particular configuration which refers to a particular phase relationship between the sampled delayed signal CKIN and the output clock signal CKOUT.

The A factor can be estimated by identifying the first 1→0 transition in the 128 bit string formed from the outputs of the flip flop group 38A. The position of this transition indicates the propagation of a rising edge of the input signal CKIN along the analog delay chain prior to the rising edge of the output clock signal CKOUT occurring.

The B factor (period of the input clock signal CKIN) evaluation is realized in the same way by sampling the 128 delay chain 34 with the second flip flop group 30 at the rising edge of the input clock signal CKIN.

Remember that the complete A and B processing and the filtering operations are made synchronously with input clock signal CKIN. Therefore, the A factor, asynchronously determined by reference to a rising edge of the output clock signal CKOUT, must be locked to the input clock signal CKIN. For this reason, the second 128 flip flop group 38B has been introduced on the output clock referenced side of the analog delay chain. A read signal READ drives this second flip flop stage. The generation of the read signal READ is described below with reference to FIG. 19.

Figure 12:
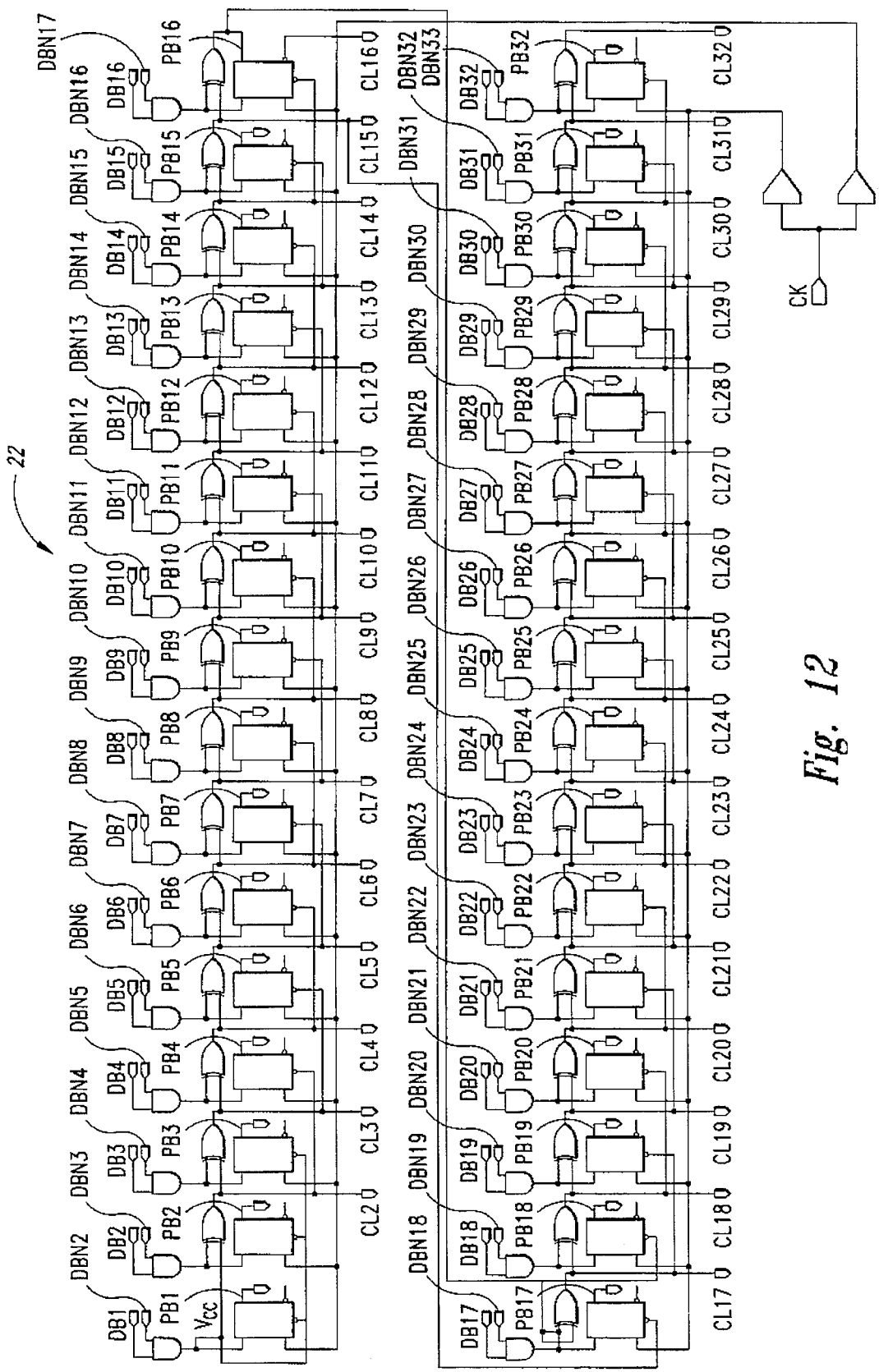
FIG. 12 is a circuit schematic of a portion of the decoder 22 of FIG. 5.

Next, the A and B factors are decoded. For example, on the right side of the bus DA is a particular delay chain output configuration to be decoded. As already explained, this operation consists in revealing the first 1→0 transition. This identification is realized with the circuit structure partially represented in FIG. 12 and can be represented analytically as:

$$DA(i) \text{ AND } NOTDA(i+1)$$

which is TRUE only if the desired 1→0 transition is found. (This will produce a "1" logic level only at the output of one latch PA.)

Figure 13:
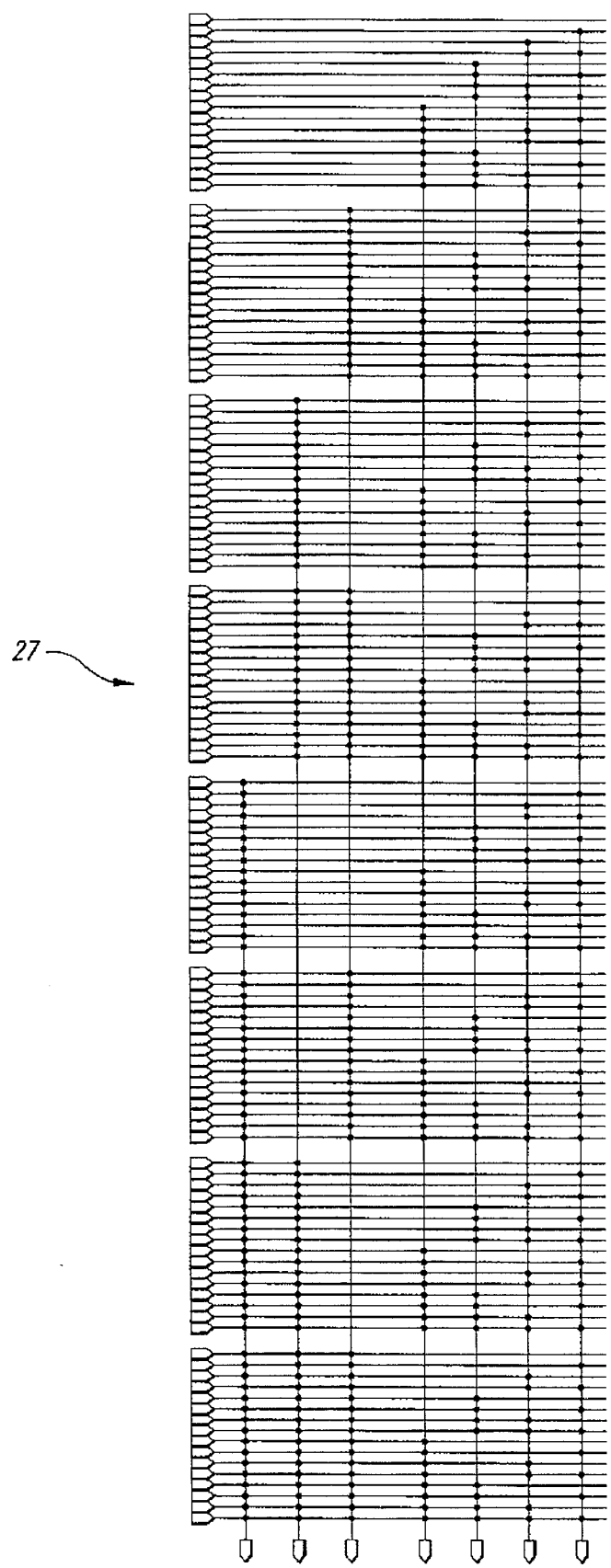
FIG. 13 is a diagrammatic representation of the multiplier 29 of FIG. 5.

The same decoding operation is done on the second bus DB(1:128), with hardware represented partially in FIG. 13. On either output bus DA, DB there will be a "1" logic state only where 1→0 transition is present.

Suppose that the input clock signal CKIN is of high enough frequency that more than one 1→0 transition is revealed along the delay chain. This situation may happen if the frequency of the input clock signal is high enough so that the period $T_{in}$ is shorter than half the time delay of the delay chain. In this case, more than one "1" will be present in the bus PB(1:128); but, we know that only the first is valid. The elimination of an unwanted "1" is achieved with the clear CL signals that are generated by the exclusive OR gate chain EXOR represented in FIG. 12. Output from the exclusive OR gates drive the (PA and PB bus buffer) clear direct input. The gate chain EXOR is initialized in such a way (see VCC in FIG. 12B) that every clear signal CL is at a high logic level (FD2 enabled) until the first "1" on DB(1:128) bus occurs. After that, the clear signal CL is in the low logic level, which means that the direct input FD2 is disabled and any other possible "1" along the latch chain is forced to a "0". The final result is that only the analog delay chain portion corresponding to the period of the input clock signal CKIN is enabled. Note that the clear signal CL acts on a two higher position direct line FD2, this permits analog delay chain length adaptivity for active frequency changing of the input clock signal CKIN.

Figure 14:
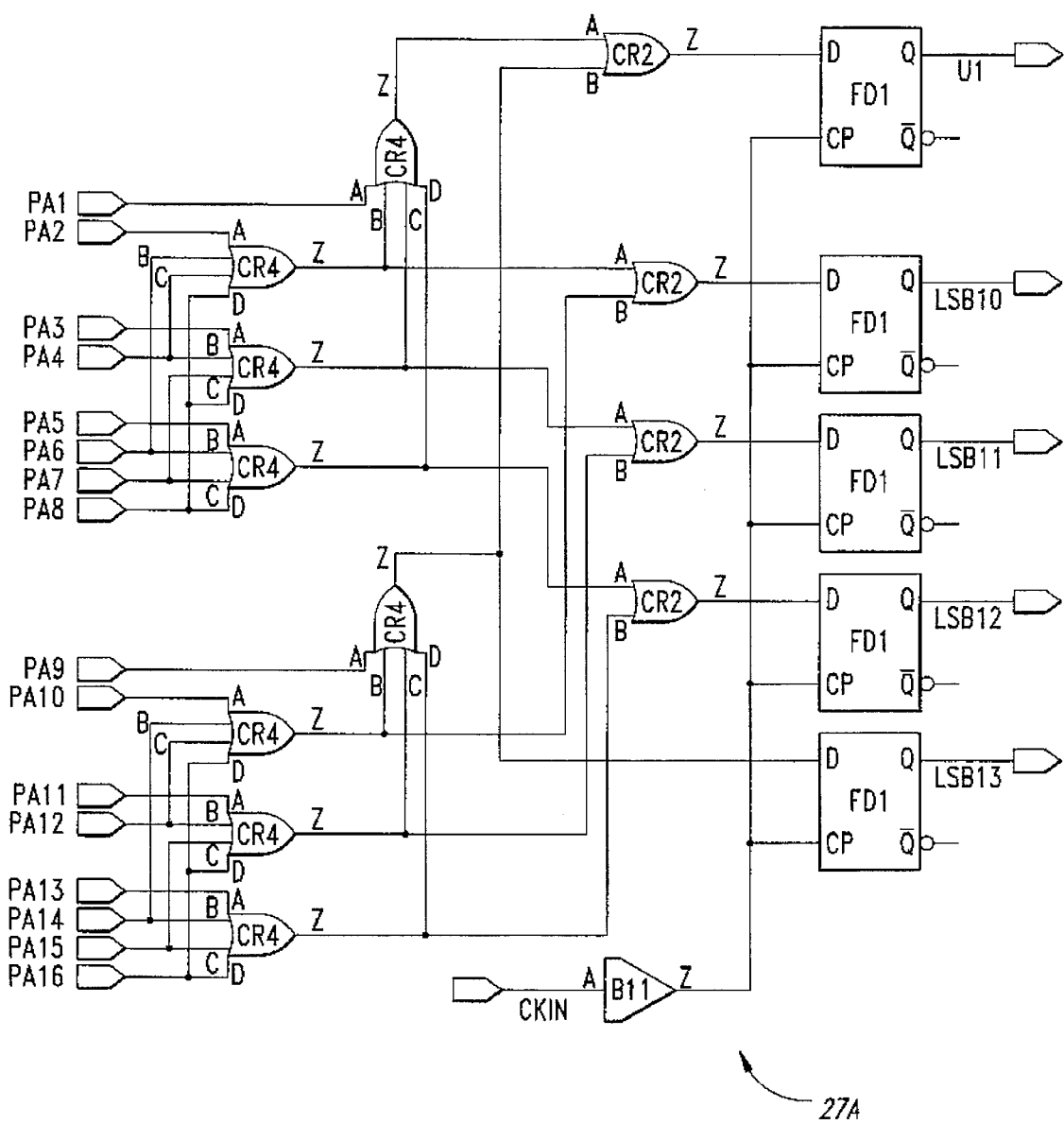
FIG. 14 is a circuit schematic of a portion of the multiplier of FIG. 13.

FIG. 13 schematically represents a classical OR section implementing the desired 128→7 bit encoding where every dot represents an input:output OR connection. To simplify this structure, in order to make it realizable with standard library gates (there are currently no 64 input OR gates available to implement 7-bit encoding), the 128 wire PA bus is encoded in 16-bit groups using 8 blocks of 16→4 bit encoding according to the structure 27A presented in FIG. 14.

In this schematic, the presence of an additional signal U may be noticed. The signal U is used to indicate if the block is working or not.

Figure 15:
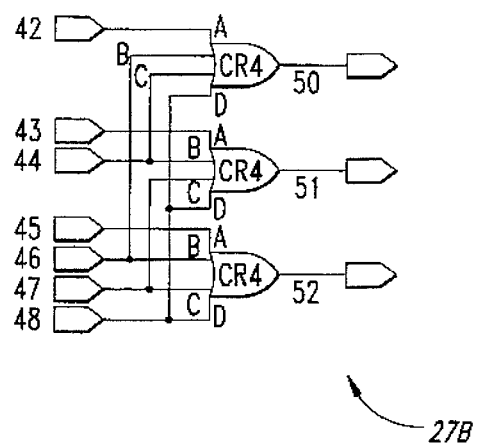
FIG. 15 is a circuit schematic of a second portion of the multiplier of FIG. 5.
Figure 16:
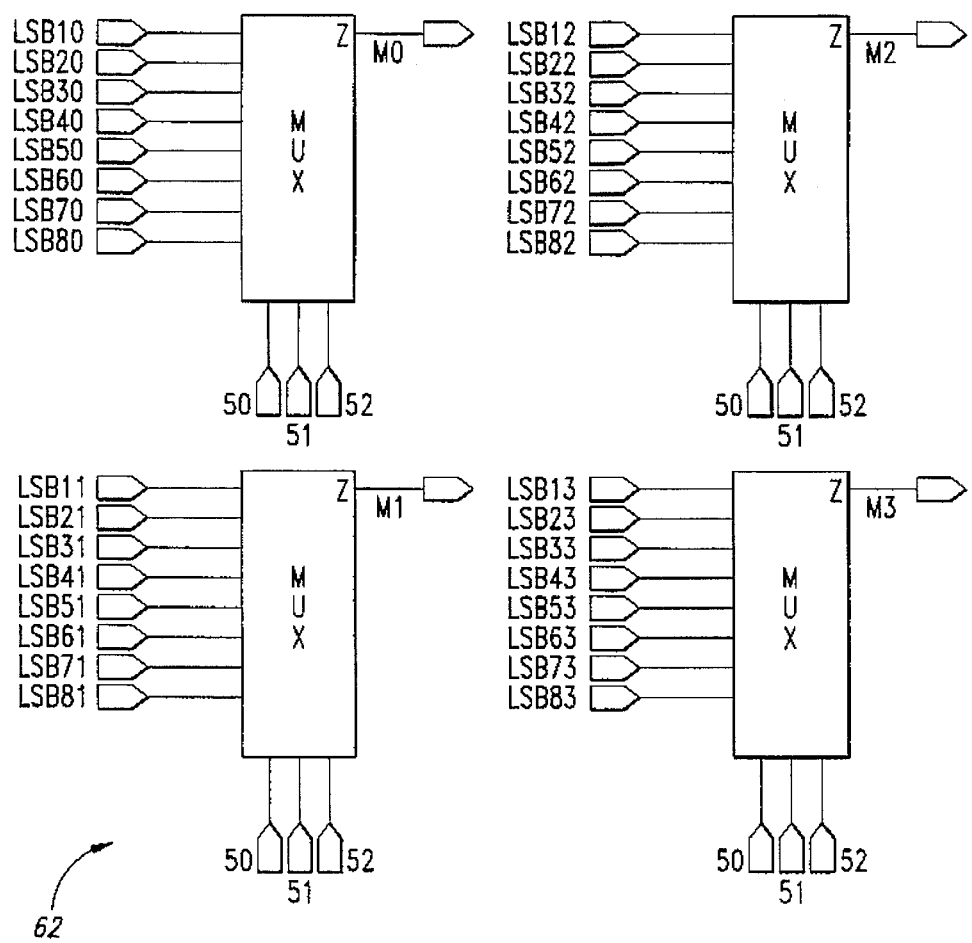
FIG. 16 is a circuit schematic of a portion of the phase detector 2 of FIG. 5.

By encoding the 8 signals U in an 8→3 bit encoder 27B (see FIG. 15), we obtain the 3 most significant bits of the instantaneous phase relationship A(4:6) that may also be used to drive the multiplexer 62 (see FIG. 16) selecting the right least significant bits A(0:3).

Figure 17:
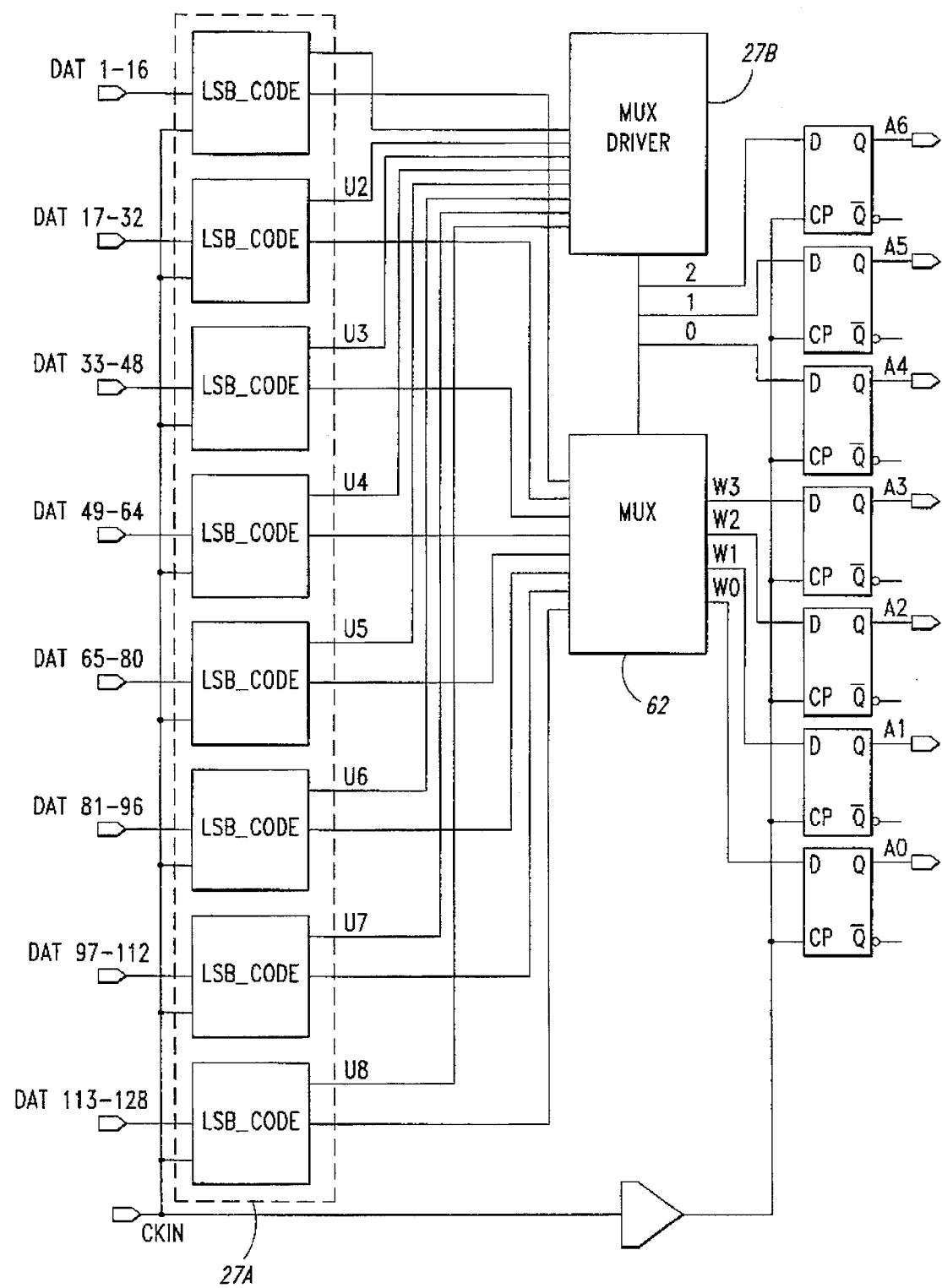
FIG. 17 is a circuit schematic of a portion of the phase detector 2 of FIG. 5.

The complete 128→7 bit encoder block diagram is represented in FIG. 17. The least significant bit encoders LSB_COD contain the same hardware represented in FIG. 13 and the multiplexer driver 27B is the 8→3 bit encoder of FIG. 15. Bus S(0:2) drives the multiplexer 62 and gives the encoded most significant bits.

To avoid delay propagation problems, this structure is implemented by pipelining the first 16→4 encoding step and the second 8→3 encoding step with a multiplexer. This implementation does not affect the processing steps.

The 1/B encoding is realized in two steps. First, the PB(1:128) bus is coded in a 128→7 bit encoder as described above. Then, a 128×14 bit word ROM gives the 1/B value. Notice that to represent 1/B, 14 bits are used. If the 1/B word length is shortened, the normalization operation becomes meaningless because a greater B value (the period of the input clock signal CKIN) would be coded with the same 1/B value.

At this point of processing, we have the A value on a 7 bit bus and the 1/B value on a 14 bit bus, the last operation is the normalization A*(1/B) realized with a 7*14 bit multiplier. It may be demonstrated that the best solution to K coding is a 6 bit representation, which means an interpolation factor of $2^6=64$. Thus, $$A:B=K: 64 \text{ or}$$

$$K=64 * (A/B).$$

The 64 times multiplication is simply realized with a 6 bit shift.

The multiplier output is a 21 bit bus (14+7) where the 0 to 6 bits represent the integer and the 7 to 20 bits the decimal part of the A*(1/B) operation (remember that A<B which means that the integer part is always equal to zero). The equivalent of the 6 bit shift operation is realized by hardware connecting only the 6 desired wires. After this virtual "shifting", the 7 to 12 bits represent integer part of the K factor. These are the only ones of interest and become the K(0:5) bus.

A self-timed control circuit 45 (FIGS. 18–20) CTLER allows synchronization between the two uncorrelated (asynchronous) clock signals CKIN and CKOUT. On the analog delay chain A side there is a first 128 bit register 38A driven by rising edges of the input clock signal CKIN. After that, the content of the register 38A must be transferred to the second 128 bit register 38B (see FIG. 10). Attempting this data locking operation with a simple master/slave configuration, where the master register is driven by the output of the clock signal CKOUT and the slave register is driven by the input clock signal CKIN, would lead to incorrect data transfer because of the complete decorrelation between the two register driver signals. The control circuit 45 monitors the clock signals CKOUT and CKIN, avoiding situations where contemporaneous rising edges would compromise data flow from master to slave (the control circuit 45 is what is commonly called a handshaking block).

Figure 28:
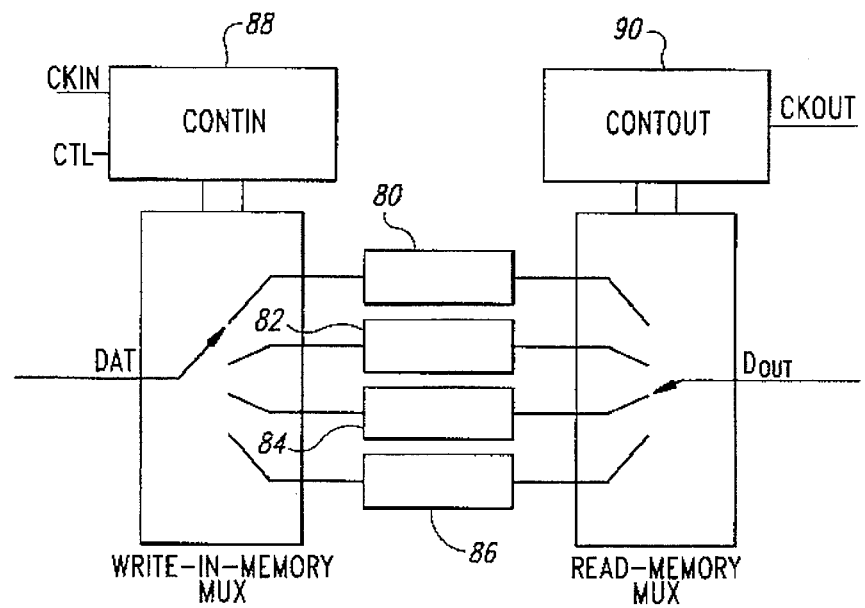
FIG. 28 is a diagrammatic representation of a portion of a write-in-memory pointer within the synchronizer 20 of FIG. 5.

The basic idea is, if new data is stored in the master register 38A (new data is the delay chain output sampled by a rising edge of the output clock signal CKOUT), and this new data is in a stable state, then the slave can read it (which means that the signal READ, in FIG. 28, is activated). Because the slave signal driver READ is controlled by the rising edge of the input clock signal CKIN (which is the new data read request), the device must determine if the read request occurred before the data stored in master reached the stable state, otherwise it must wait for the data to reach the stable state. Then, the slave driver signal READ will be generated.

Since $T_{out} > T_{in}$, that is, the period of clock signal CKOUT is greater than that of the clock signal CKIN, there will occur situations periodically where two successive rising edges of the clock signal CKIN at the higher frequency fin present themselves after a single rising edge of the lower-frequency clock signal CKOUT.

This causes two reading requests for the same data. This situation is controlled by the control circuit 45, having its general architecture presented in FIG. 18, such that only one read signal READ is generated because there is no new data. Advantageously, in an undedicated circuit use no data will be lost. In fact, data transfer from master to slave is guaranteed for every read operation independently of the clocks' asynchronicity.

Figure 18:
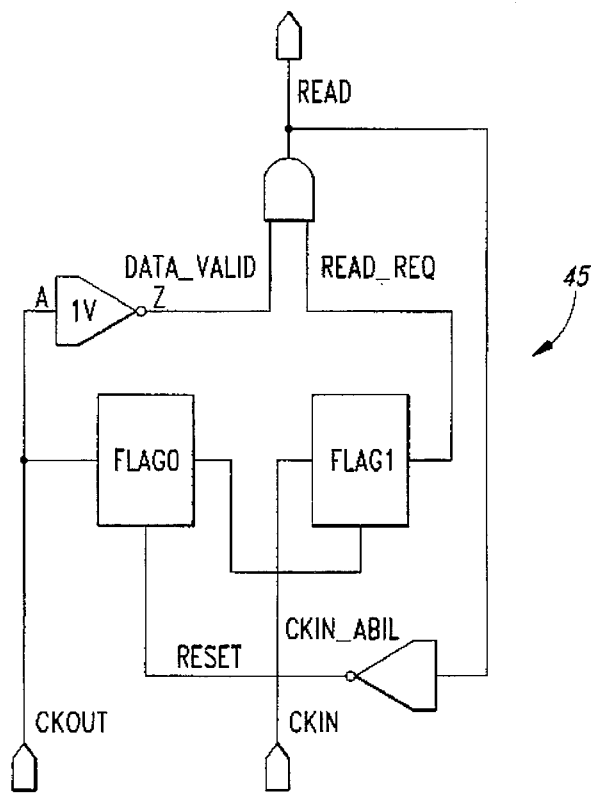
FIG. 18 is a diagrammatic representation of the general architecture of a portion of the logic protocol of FIG. 19.
Figure 19:
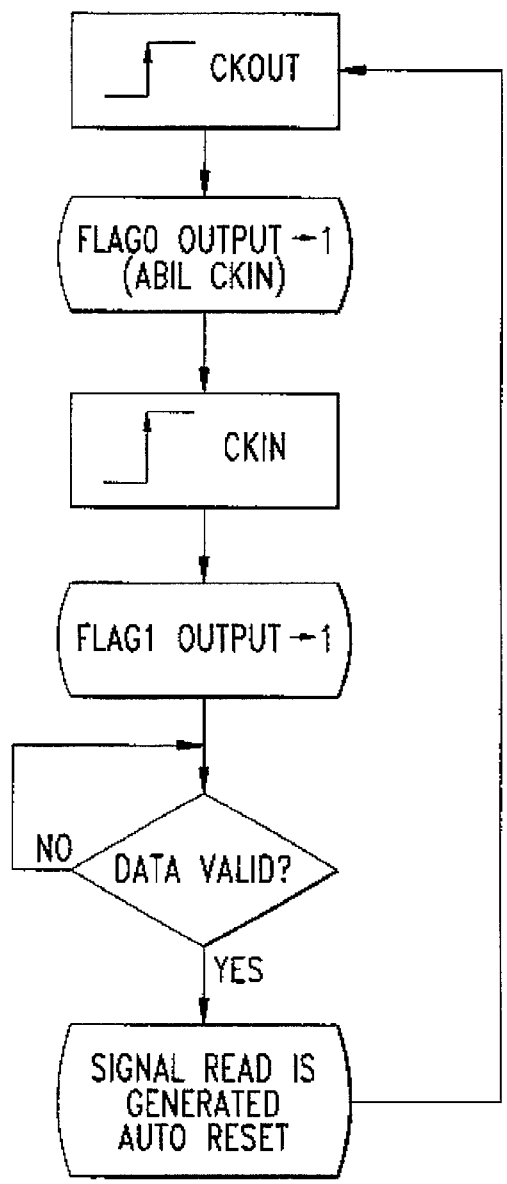
FIG. 19 is a flow diagram of a logic protocol of the scanning frequency converter of FIG. 7.

The block diagram of FIG. 19 presents the handshaking protocol followed by the control circuit CTLER shown in FIG. 18. Elements FLAGO and FLAGI are edge triggered memory elements having outputs set to 1 when a rising edge is present at their inputs and are reset when a CLEAR DIRECT input is in the low logic state. This is realized in hardware with flip flop, whose D input is constantly set at 1 as shown in the circuit schematic of FIG. 20.

In this circuit implementation, it has been assumed that half a period $T_{OUT}$ is sufficient to let the data stabilize in the master register, so a low period in the output clock period is used as DATA VALID signal.

Figure 20:
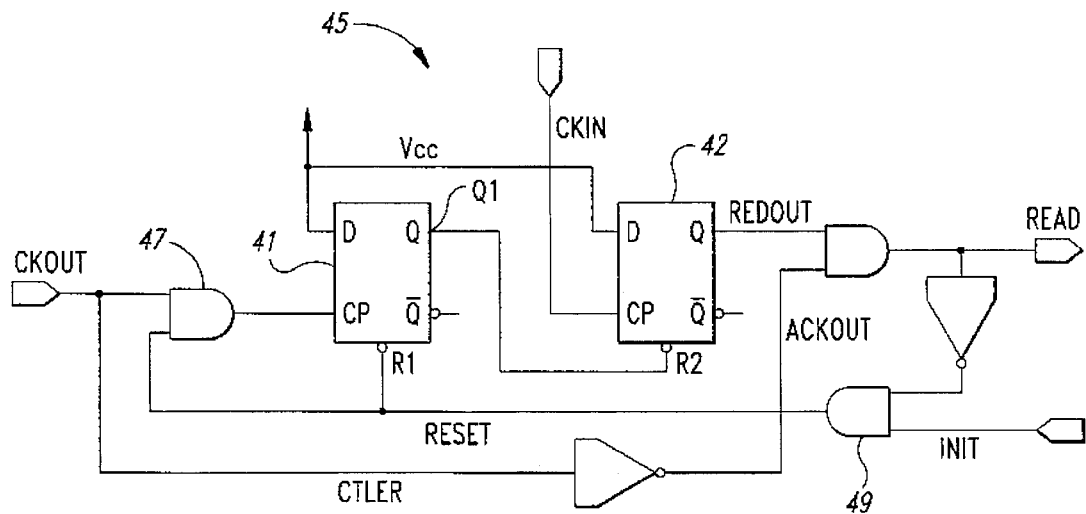
FIG. 20 is a circuit schematic of a portion of the scanning frequency converter for realizing the logic protocol of FIG. 19.

FIG. 20 presents an electrical schematic of the control circuit 45. Note the presence of an AND gate which is opened only during a READ/RESET operation in order not to lose any rising edges of the output clock signal CKOUT and the consequent data transfer from the master to the slave.

The control circuit 45 reset is realized using the built in loop delay. This is shown in greater detail in FIG. 20. The circuit 45 is shown in FIG. 20 as comprising a bistable pair 41 and 42, such as two SCR flip-flops which have respective set inputs S1, S2 held at a logic high for connection to a supply pole Vc.

Applied respectively to other, or clear, inputs C1, C2 are the clock signals CKOUT and CKIN.

In particular, the output clock signal CKOUT is applied to an input of a logic AND gate 47 which receives, on the other input thereof, the initialization signal R.

The output of said gate 47 is connected to the clear input C1 of the first bistable 41, which has its output Q1 connected directly to the reset input R2 of the second bistable 42.

To the reset input R1 of the first bistable 41 there is applied the initialization signal R, through an inverter 43 and a logic NOR gate 44 having two inputs.

The negated output QN2 from the second bistable 42 generates the signal READ and is connected to one input of a logic gate 46 receiving, on the other input thereof, the signal at sampling frequency CKOUT.

The output of this gate 46 is applied to the other input of the other logic NOR gate 44.

On the arrival of a rising edge of the output clock signal CKOUT, the output Q1 of the first bistable 41 is switched to a logic high, thereby enabling the second bistable 42.

Thus, the arrival of the rising edge of the input clock signal CKIN brings the output QN2 of the second bistable 42 to a logic high.

If the data is presently judged to be valid, for the reasons explained in connection with the period of output clock signal CKOUT, then the read enable signal READ is generated.

It matters to consider here the presence of the AND gate 47 which would only be open during the readout and reset operations in order to prevent loss of any rising edge of the output clock signal CKOUT, and the consequent transfer of data to the slave portion 38B from the master portion 38A.

Upon generation of the signal READ, the reset operation is started at once because the initialization signal R corresponds to the inverted signal READ being applied to the input R1 of the first bistable 41.

Figure 21:
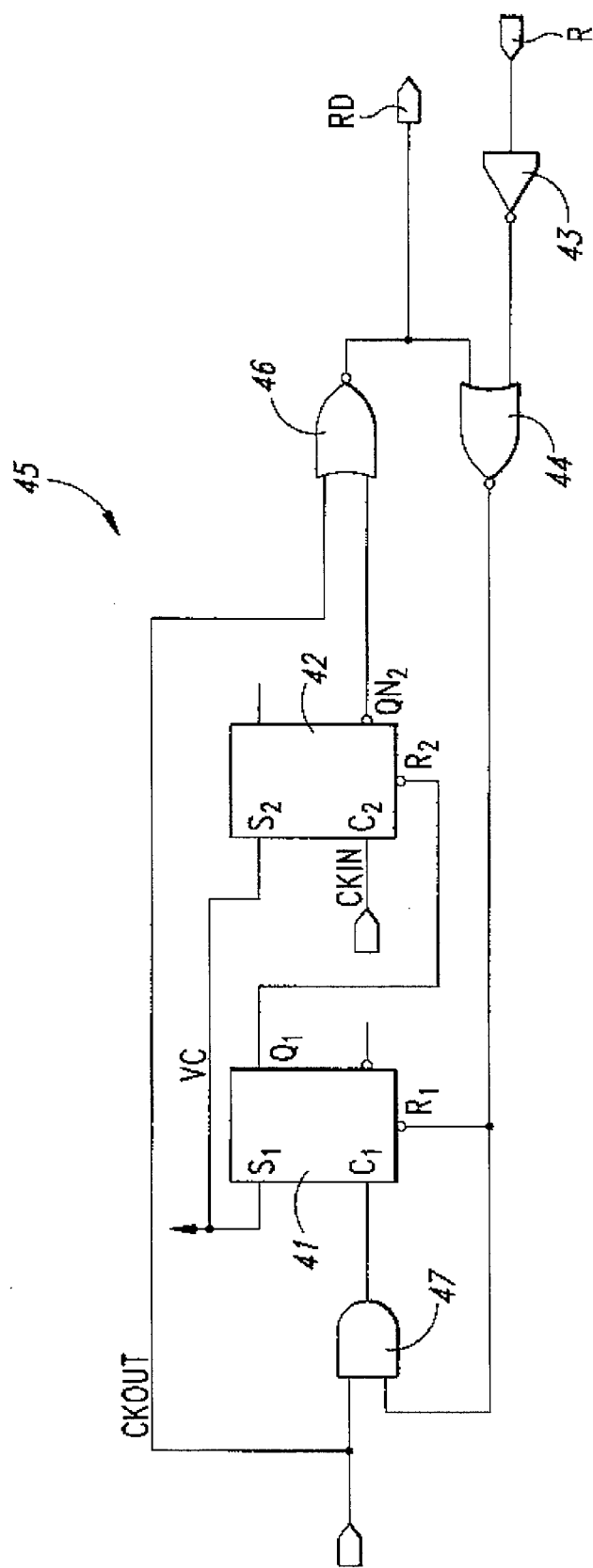
FIG. 21 is a circuit schematic of an alternative of the circuit presented in FIG. 20.

The reset operation is complete with the return of READ to a logic low, and the auxiliary circuit 45 is ready for a fresh operation cycle. After the READ signal is generated (READ 0→1), the reset operation begins. The RESET signal, equal to an inverted READ, drives clear direct_input of the flip-flop 41. When READ comes back to 0 the reset operation is over and the circuit is ready for a new handshaking cycle. It is important to notice the presence of another AND gate 49 in the feedback loop. The second AND gate is used to force the circuit into the desired initial conditions. That is, the INIT signal is held low until the circuit initialization is 1. Then the INIT signal is constantly held high to close the feedback loop. An alternative to the circuit of FIG. 20 is shown in FIG. 21. The circuit of FIG. 21 operates according to the same principles, but employs exclusive OR gates in the feedback loop.

The situation where two rising edges of the input clock signal CKIN occur during one period $T_{out}$ is identified by the term "empty space" and illustrated in FIG. 8 by a segment 48 of the control signal CTL corresponding to rising edges $Y_{i+1}$ and $Y_{i+2}$. Control signal CTL will be generated by updating the value of the interpolation coefficient K only upon rising or falling edges of the clock signal CKOUT at output frequency Fout and comparing subsequent values of the interpolation coefficient K at two subsequent edges of the clock signal CKIN at the frequency Fin. If the two subsequent values are equal, the interpolation coefficient K will not have been updated during the given period of the input clock signal CKIN. This is because the interpolation coefficient K is a function of the instant phase relationship A between the clock signals CKIN and CKOUT. This phase relationship A changes for subsequent measurements at rising or falling edges of the clock signal CKOUT when the clock signals CKIN and CKOUT are at unequal frequencies. Consequently, the interpolation coefficient K will also change for subsequent edges of the clock signal CKOUT at frequency fout.

Figure 22A:
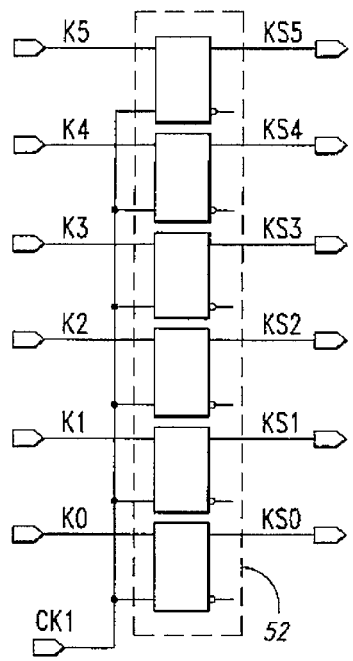
FIG. 22A is a circuit schematic of a portion of the interpolation filter 15 of FIG. 5.
Figure 22B:
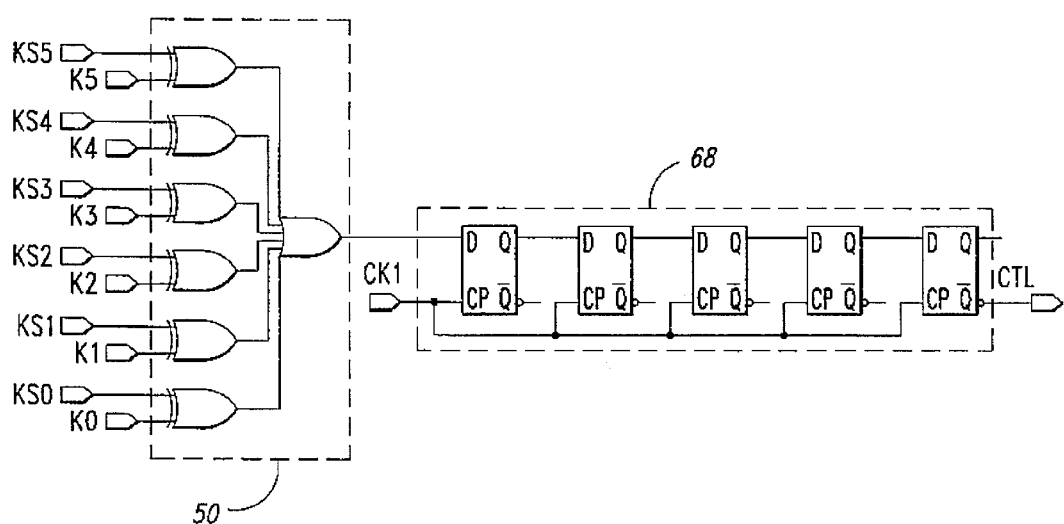
FIG. 22B is a circuit schematic of a portion of the interpolation filter 15 of FIG. 5.
Figure 23:
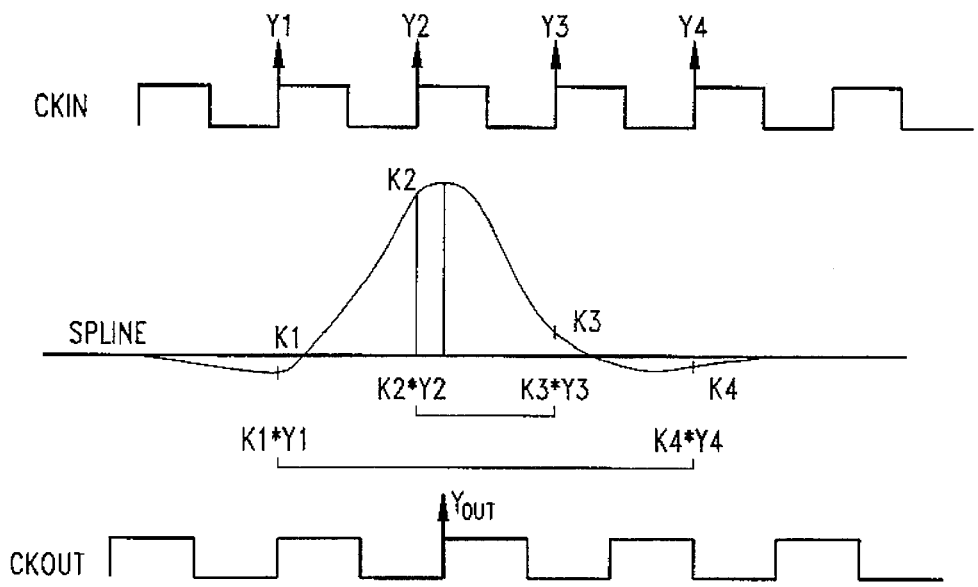
FIG. 23 is diagrammatic interpretation of a spline interpolation according to the invention.

One technique for performing the comparison is shown in FIGS. 22A–B. The interpolation coefficient K is input directly to a comparator 50 and to a delay element 52. The delay element 52 inserts a delay equal to one period of the clock signal CKOUT. The delayed sample of the interpolation coefficient K from the delay element 52 is then input to a second input of the comparator 50. The comparator 50 then compares the current coefficient K with the delayed coefficient K from the delay element 52 at subsequent rising or falling edges of the clock signal CKIN. If they are equal, the control signal CTL is then generated, indicating that the interpolation coefficient K was not updated during that period of the clock signal CKIN.

This operation is very simple in light of how the A factor locking operation is realized by the self-timed control circuit CTLER. Remembering that data transfer is always guaranteed and that when a second data request is present for the same data (one "empty interval" is present) the same data is repeated on the CKIN-locked bus. In this way, "empty intervals" are easily detected by comparing the present K value with the past one. When these two values are equal, then the control signal CTL will be generated. The hardware implementing this operation is represented in FIGS. 22A–B KSI is the present value of A/B and K is the past value. CTL is "high" only if KSI=K bit by bit.

In the event of a so-called empty space being input, that is when two rising edges of the input clock signal CKIN arrive following a single edge of the output clock signal CKOUT, the control signal CTL is generated and input to the synchronizer 20 to disenable updating of the data in the write section of synchronizer 20.

Alternatively, the control signal CTL can be input to the master/slave register 40 to allow data transfer to the slave portion 38B only of the master/slave register 40.

Accordingly, the transfer of data to the slave portion 38B from the master portion 38A can be ensured at all times and in any case, irrespective of the asynchronous condition of the clock signals CKIN and CKOUT.

Figure 24:
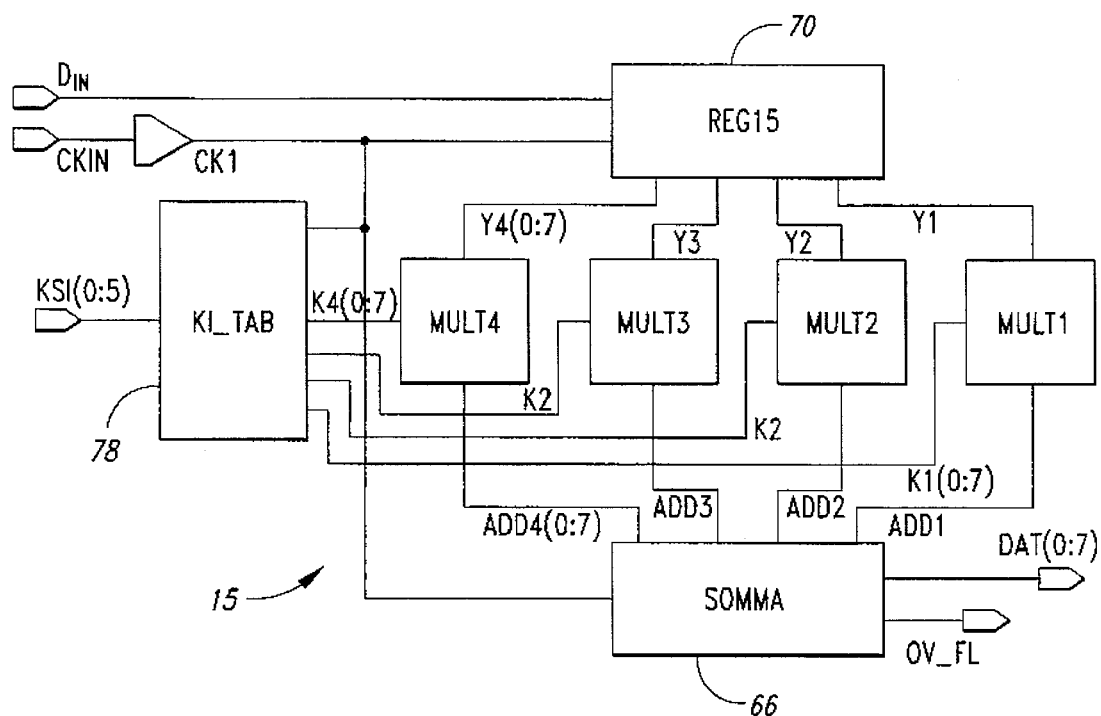
FIG. 24 is a circuit schematic of a portion of the interpolation filter 15 of FIG. 5.

The control signal CTL enables proper operation of the synchronizer 20, because it is used to detect and eliminate the "nonsense" interpolated samples from the filter 15 caused by "empty intervals." For this reason, the control signal CTL is generated with an n-clock shot delay using the flip flop chain 68 of FIG. 24, where n is the number of flip flop delays needed by the filter 15. In this way CTL, which is advantageously inverted, detects the proper sample referring to the "empty intervals." The control signal CTL output from comparator 50 and delay chain 68 is then input to synchronizer 20.

The method of operating the device 1 of this invention will now be described which, on the whole, can be said to be asynchronous in that it uses two clock signals CKIN and CKOUT whose frequencies Fin and Fout are unrelated to each other.

The SFC 1 could carry out the frequency conversion by means of a conventional linear interpolation algorithm, for example, as given by the following formula:

$$Yout = (1-K)*Yn + K*Yn+1 \quad (1)$$

where, Yout is the output signal obtained from a weighted mean of n plural contiguous signals multiplied by the weight coefficient K, which constitutes the single independent variable in this relation.

As discussed above, the weight coefficient or instantaneous phase relationship K is computed as the A/B ratio of the instant phase relationship A, between the clock signals CKIN and CKOUT, to the period B of just the input clock signal CKIN.

More particularly, the SFC 1 carries out the conversion using a more sophisticated interpolation algorithm, as given by the following relation:

$$Yout = Y1*K1 + Y2*K2 + Y3*K3 + Y4*K4 \quad (2)$$

where the various weight coefficients Ki are a function fi(K) of the aforementioned coefficient K. FIG. 24 shows graphically a spline algorithm according to equation (2).

The device of this invention performs the sampling frequency conversion in two discrete steps.

First, the value Yout of the interpolated data sample is computed synchronously with the input clock signal CKIN; thereafter, this value is latched to the output clock signal CKOUT, to thus complete the conversion operation.

To this aim, at each scan pulse of the input clock signal CKIN, the phase detector 2 effects an estimate of the instant phase relationship A and the period B of clock signal CKIN as described above.

The decoder block 3 is also to compute the weight coefficient K=A/B previously referred to as the normalized instant phase relationship.

The coefficient K is encoded on a six-bit bus and corresponds essentially to an interpolation factor M=26–64.

This coefficient K is transferred to the interpolation filter 15 which will implement the algorithm according to formula (2) above, to thus effect a so-called four-range weighted mean of the sampled signal Din.

In essence, the weighted mean is carried out on four contiguous inputs of the sampled signal Din, and the weight coefficients K can be stored in a programmable read-only memory. Thus, the interpolation factor can be read out consistently with respect to the characteristics of the signal D.

Figure 25:
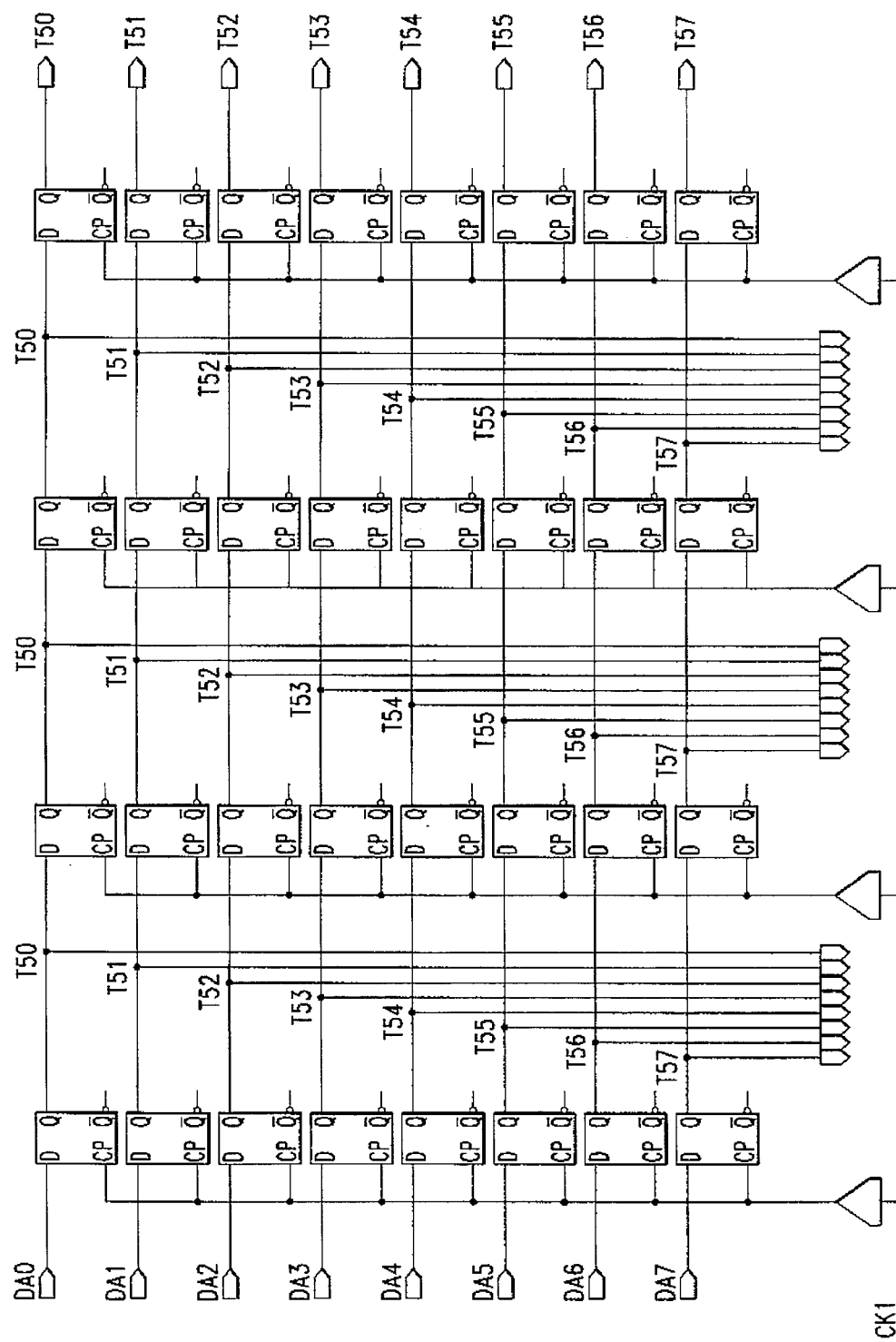
FIG. 25 is a circuit schematic of the register portion of the circuit portion of FIG. 24.
Figure 26A:
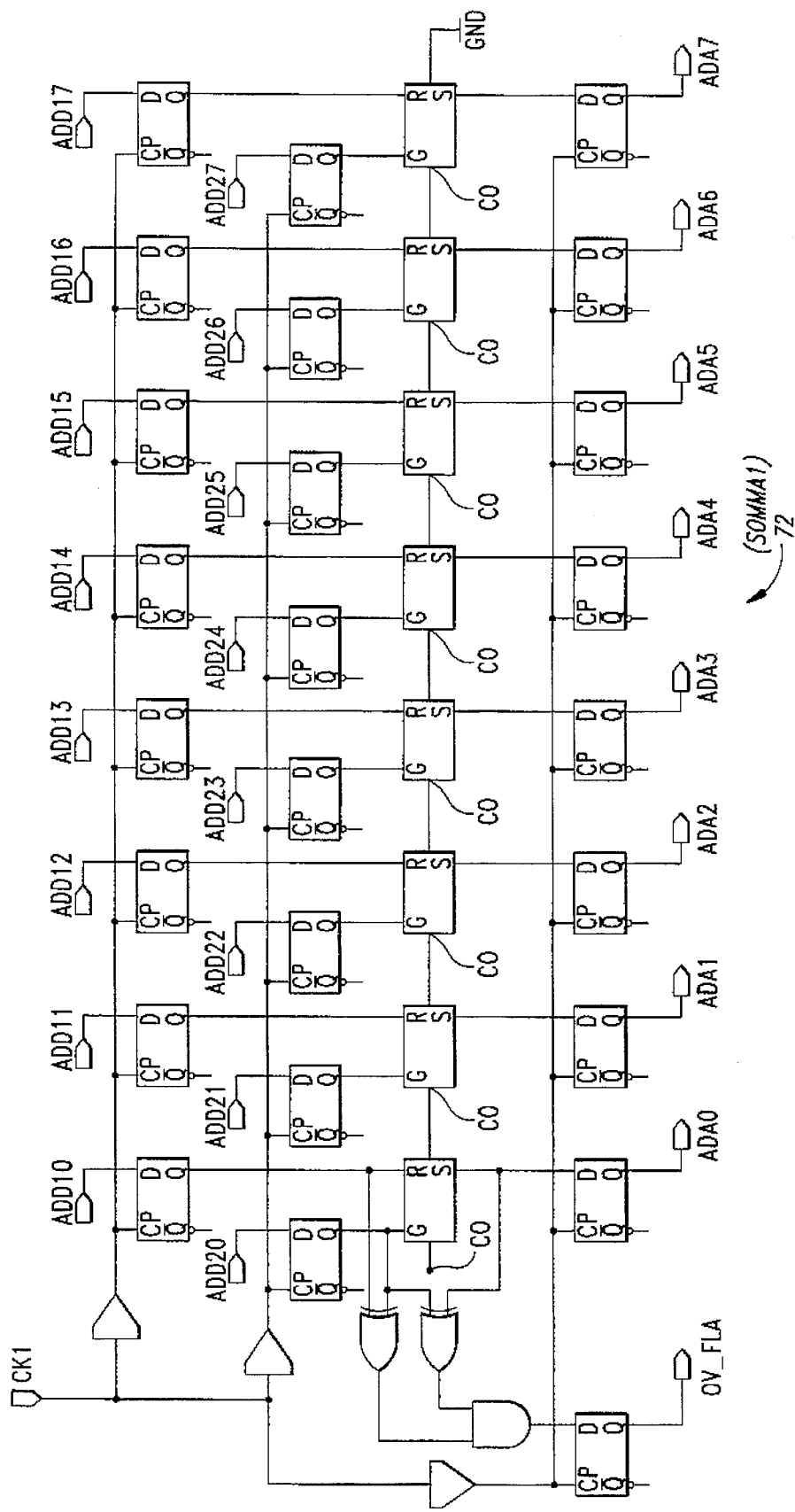
FIG. 26A is a circuit schematic of a portion of the adding section SOMMA of FIG. 24.
Figure 26B:
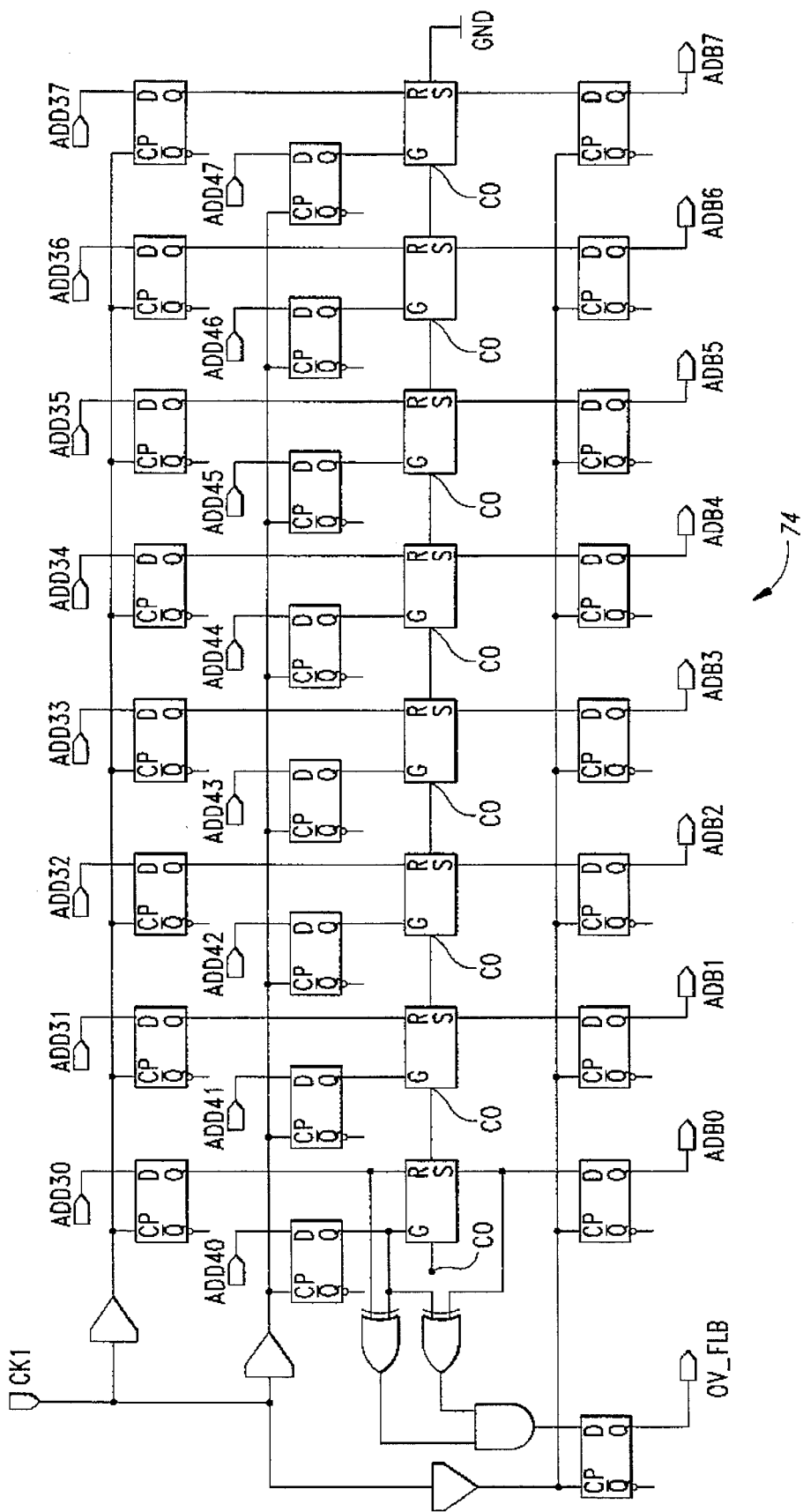
FIG. 26B is a circuit schematic of a portion of the adding section SOMMA of FIG. 24.
Figure 26C:
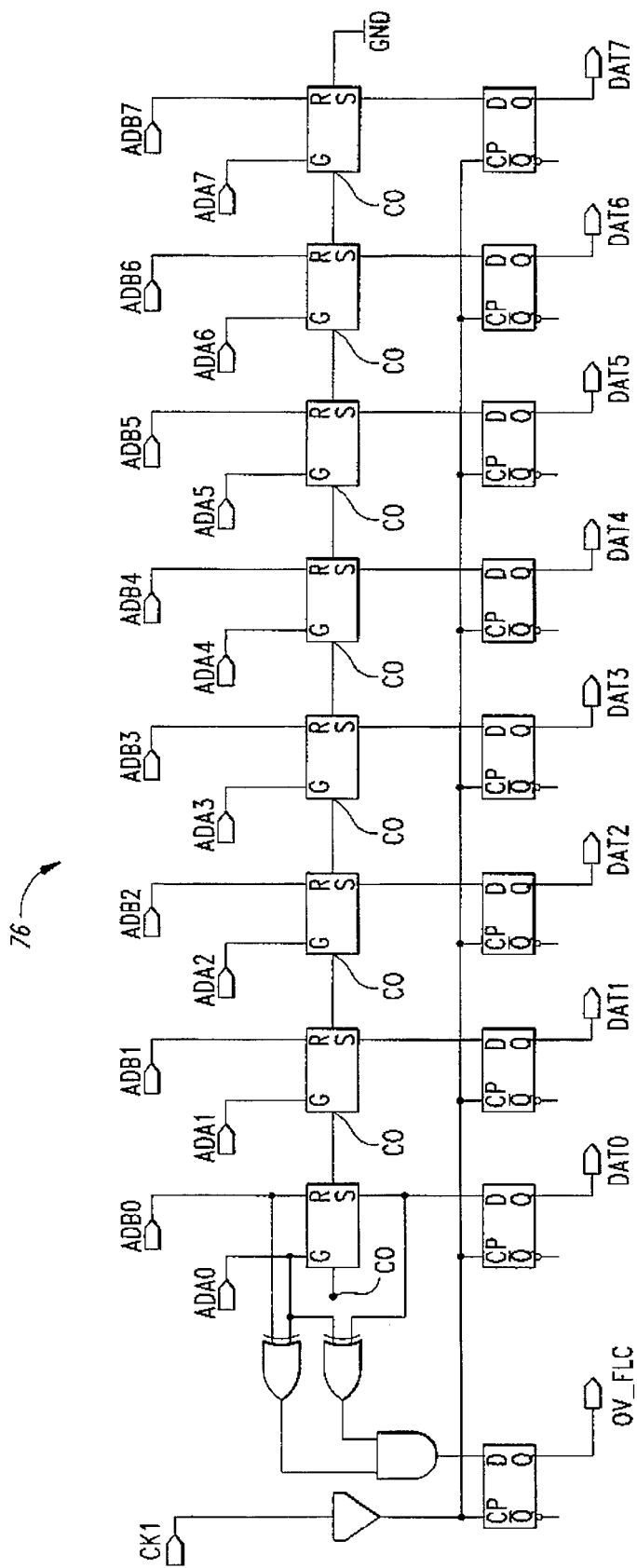
FIG. 26C is a circuit schematic of a portion of the adding section SOMMA of FIG. 24.
Figure 26D:
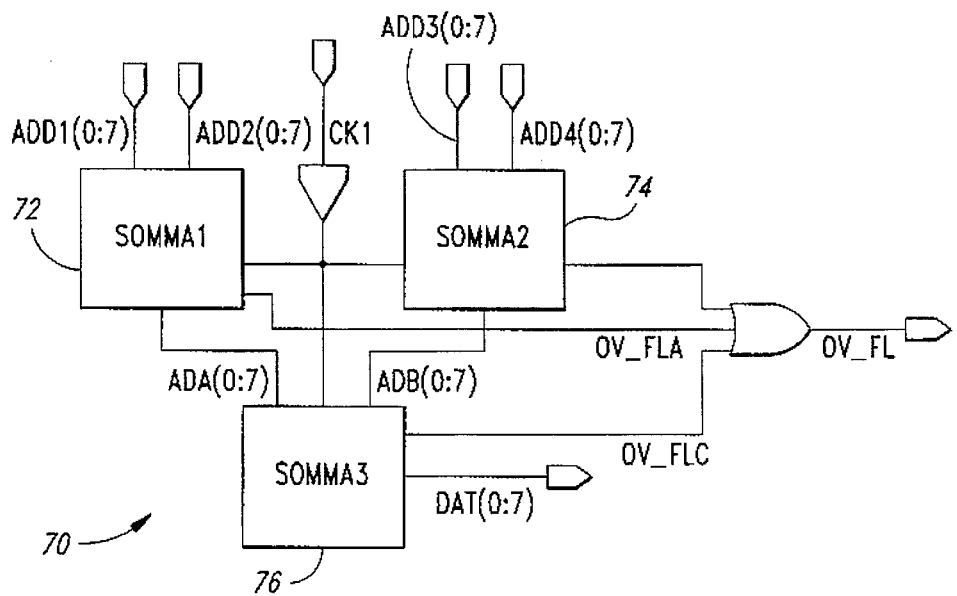
FIG. 26D is a circuit schematic of a portion of the adding section SOMMA of FIG. 24.

The filter 15 is the input sample processing unit and is organized as a canonic four tap FIR structure as shown in FIG. 24. Unlike the usual FIR filter, the FIR filter coefficients are not constant but change at every clock pulse. The KSI signal, which is also referred to as the "instantaneous normalized phase relationship" K is used to the desired weight coefficients for the FIR averaging. The input sample operations have been pipe lined to reduce delay propagation problems due to high clock frequencies. The register block 70 contains four 8 bits registers and represents the FIR delay section, shown in greater detail in FIG. 25. The FIR filter 15 uses four multipliers to implement the "modified Booth's algorithm" for 2's complement input sample coding, and in one clock period the product $ADD_i = Y_i * K_i$ is available.

The adding section 66 (SOMMA) is realized with a tree structure having three parts 72, 74, 76 (SOMMA1, SOMMA2, SOMMA3) (see FIGS. 26 A, B, C, D), with the interpolated data being available on bus DAT(0:7) after two clock periods. The overflow output OV_FL may be used to reveal incorrect adding computation. The table KI_TAB is a block containing a 64×32 bit word ROM containing the Spline interpolator coefficients as shown in FIG. 17.

As discussed above, the preferred representation of the factor K (in this block renamed KSI) employs a 6 bit bus, so the FIR coefficient has been calculated by oversampling the Spline impulsive response 64 times ($2^6$) and quantizing the samples on 8 bits. Every 32 bit word is divided into 4 bytes, which represent the Spline weight coefficients.

Figure 27:
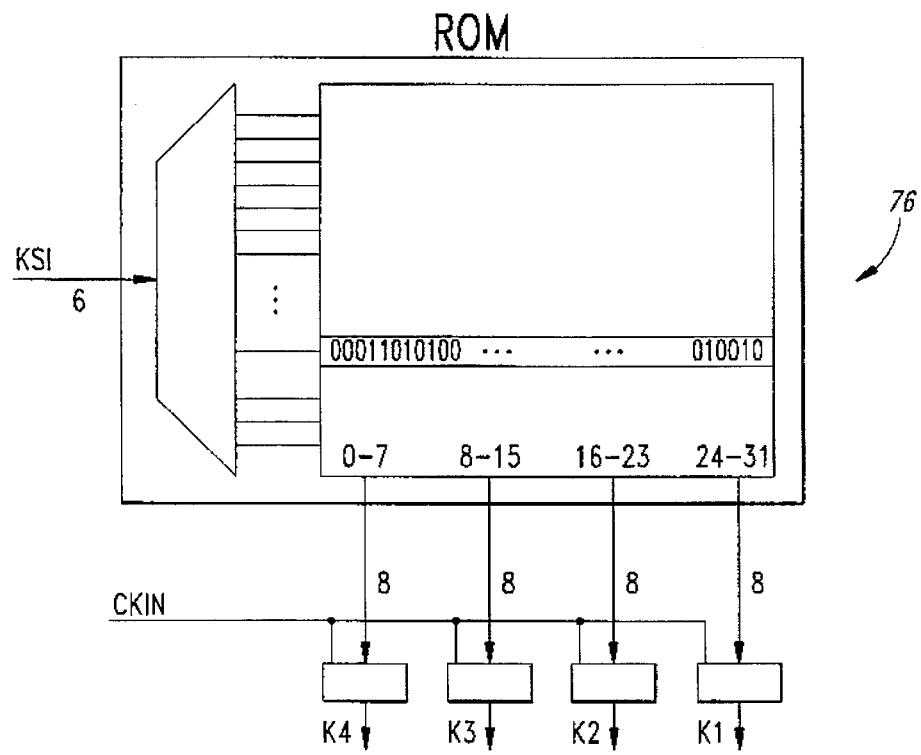
FIG. 27 is a diagrammatic representation of a weighting coefficient identification portion of the device of FIG. 5.

FIG. 27 shows how $K_i$ is correlated with the K factor. As described above, the filter 15 generates the interpolated data flow locked to the input clock signal CKIN. To complete the conversion operation this data flow must be locked to the output clock signal CKOUT.

The synchronizer 20 (FIG. 7) will transform the interpolated values of the signal Din, at the input clock frequency CKIN, into values at the output clock frequency CKOUT; all this under control by the signal CTL which reveals any overlap in the clock signals CKIN and CKOUT at the input and output sampling frequencies fin and fout to promote phase readjustment within the synchronizer 20.

Figure 29A:
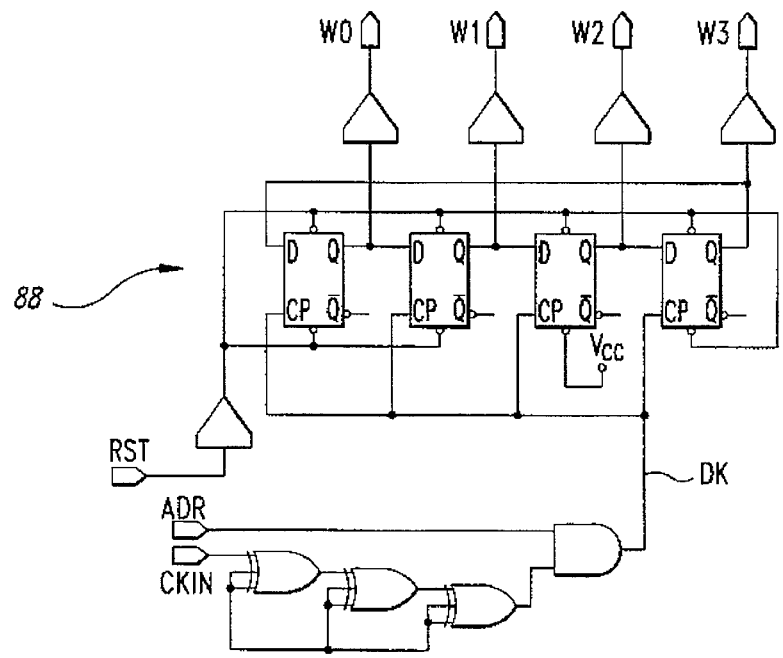
FIG. 29A is a circuit schematic of a portion of a write-in-memory pointer within the synchronizer 20 of FIG. 5.
Figure 29B:
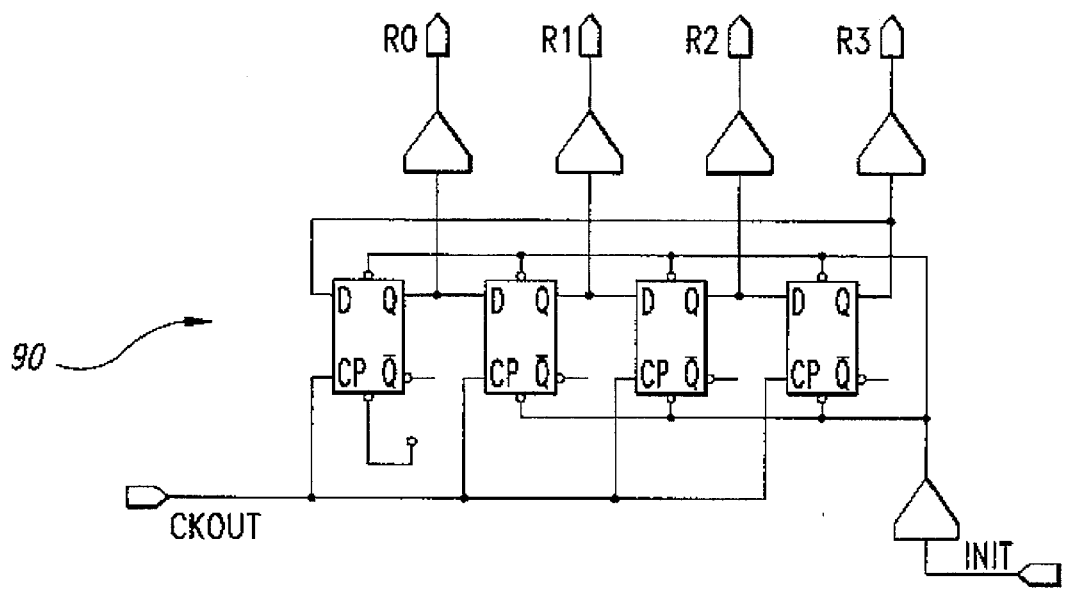
FIG. 29B is a circuit schematic of a portion of a write-in-memory pointer within the synchronizer 20 of FIG. 5.

The synchronization operation is realized as follows. The input clock signal CKIN drives the write-in-memory signals. At every pulse of the input clock signal CKIN new data arriving on bus DAT(0:7) is sequentially stored in one of the four memory registers 80, 82, 84, 86. The output clock signal CKOUT drives the read-memory-multiplexer, which outputs on bus DATAOUT(0:7) the memory content data. In FIG. 28, the registers 80, 82, 84 control blocks 88, 90 (CONTIN and CONTOUT) are represented. As shown in FIGS. 29A and 29B the blocks 88, 90 are made of four flip flop loops. Every flip flop output (called a pointer) drives a register read or write operation.

The initialization signal INIT must be held low until the first control signal CTL arrives for a correct synchronizer 20 use so that the read and write pointers are set in the right position. Afterward, at every clock shot the pointers are incremented. The synchronizer 20 does not permit read and write direct interaction on the same memory register. This is made possible by the control signal CTL which can stop the write-in-memory pointer incrementation ($F_{in}$ is higher than $F_{out}$) when it is trying to write in a register before its old content is read out. Remember that during write-in stop intervals (CTL is low), meaningless interpolated data is present at the SYNCRO input. Because this occurs during an "empty interval", the samples are discarded. In this way only the meaningless samples are lost.

Figure 30:
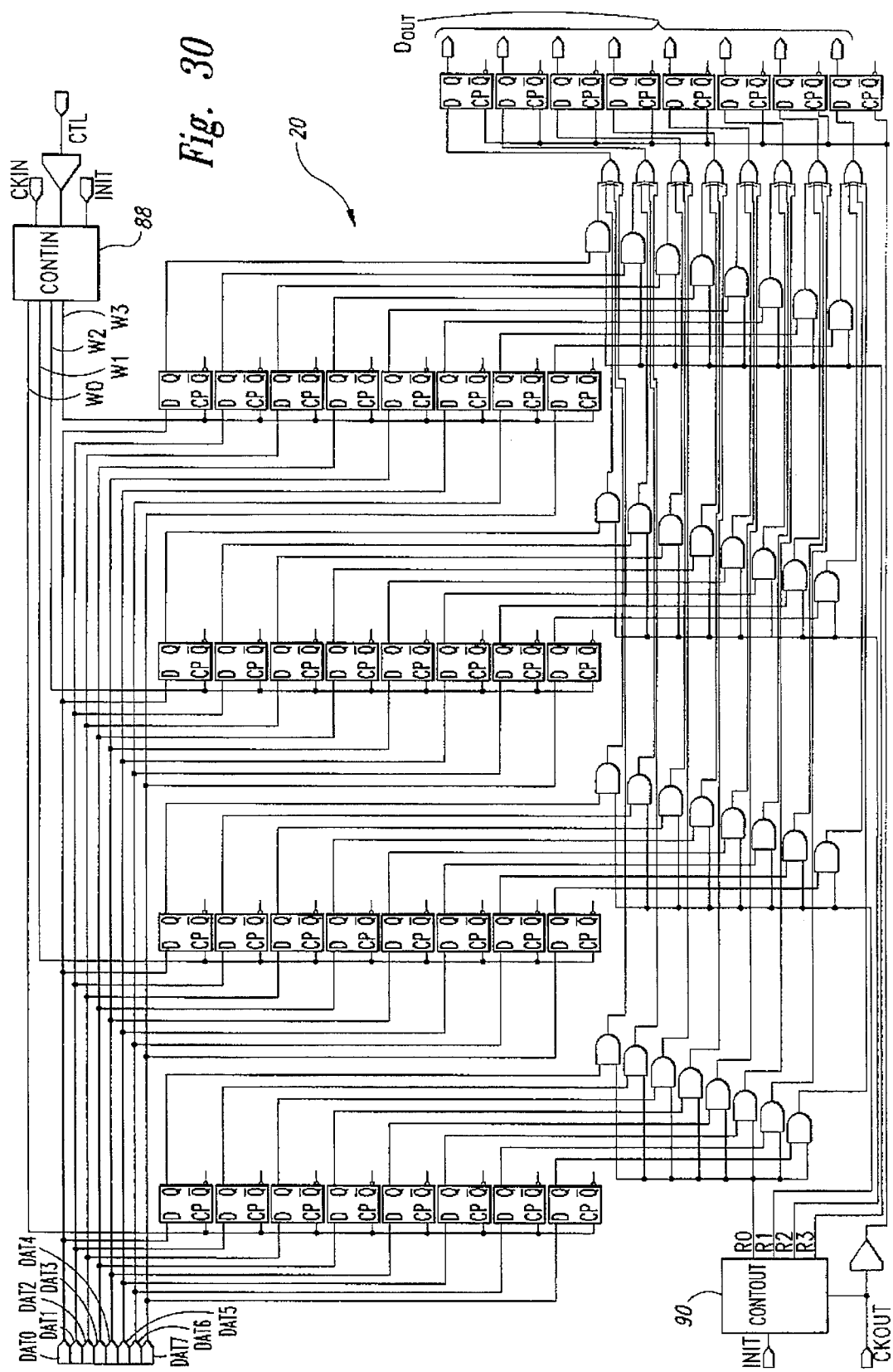
FIG. 30 is a circuit schematic of the synchronizer 20 of the scanning frequency converter of FIG. 5.

In FIG. 30 the whole synchronizer 20 schematic is presented. The four register memory structure is evident and the output-multiplexing net is realized with the AND/OR net presented therein. The write-in-memory pointer stop is realized by the block 88 with the AND gated input clock signal CKIN (FIGS. 29A–B). CTL is "low" during "empty intervals". At the AND input, the input clock signal CKIN appears opportunely delayed to avoid spikes on line INC, which would compromise operation of the synchronizer SYNCRO.

This device can be operated in a multi-standard mode because it can convert input frequencies automatically within a range of frequencies, such as a 10 to 27 MHz band.

We claim:

1. An electronic device for the automatic conversion of sampling frequencies, being a type adapted to convert a predetermined frequency of a sampled input signal to a desired output signal frequency, characterized in that it comprises:

a phase detector being input both the input and the output frequencies, the phase detector including a master register;

a decoder block associated with the detector to determine an interpolation coefficient, the decoder producing a digital signal representative of the interpolation coefficient;

an interpolation filter having a digital input for encoding the sampled input signal, and receiving an input clock signal of the input frequency, on the one side, and the digital signal representative of said interpolation coefficient from an output of the decoder block, on the other side;

a comparator circuit having a control output coupled to an input of the synchronizer coupled between the phase detector output and the digital input of the interpolation filter; and a synchronizer, connected after the filter and being input both said input clock signal and an output dock signal at the desired output signal frequency, the synchronizer having a digital output for outputting the converted sampling signal.

2. A device according to claim 1, characterized in that said master register comprises a master storage portion controlled by the output clock signal and connected in parallel to another, corresponding slave portion controlled by the input clock signal.

3. A device according to claim 2, characterized in that it further includes an auxiliary circuit for generating a read enable signal to read out data from the master portion to the slave portion of said register.

4. A device according to claim 3, characterized in that said auxiliary circuit comprises:

a bistable pair having respective set inputs connected electrically to a supply pole Vc, reset inputs and clear inputs to which the input and output clock signals are respectively supplied, the output of a first of the bistables being connected directly to a reset input of the second bistable;

an initialization signal applied to the reset input of the first bistable through an inverter; and a logic NOR gate having two logic inputs and receiving at one logic input said output clock signal and, at the second logic input, the signal from an inverted output of the second bistable to generate said read enable signal.

5. An electronic device for the automatic conversion of an input data signal at an input frequency corresponding to an input clock signal to an output data signal at a desired output frequency corresponding to an output clock signal, comprising:

a data input for receiving the input data signal;

a first clock input for receiving a clock signal at the input frequency;

a second clock input for receiving the output clock signal;

a phase detector having a phase detector output, and connected to receive the input clock signal from the first clock input and the output clock signal from the second clock input;

a decoder structure associated with the phase detector having an interpolation coefficient output for producing a digital signal indicative of an interpolation coefficient;

an interpolation filter having a primary data clock input, a digital input, and an interpolation filter output, said interpolation filter receiving the input data signal at the primary data input, the input clock signal at the clock input, and the digital signal from the interpolation coefficient output at the digital input for interpolating the input data signal in response to the interpolation coefficient and producing interpolated data in response thereto;

a comparator circuit having a control output coupled between the phase detector output and the digital input of the interpolation filter, and a synchronizer having a data input, a first frequency input and a second frequency input, connected to receive the interpolated data from the interpolation filter output at the data input, and connected to receive both said input clock signal and output clock signal, said synchronizer having a synchronizer output.

6. A device according to claim 5, wherein the control output from said comparator circuit is applied to the first frequency input of the synchronizer.

7. A device according to claim 5, wherein the decoder, includes a register, comprising a master portion and a slave portion.

8. A device according to claim 7 wherein transfer of data from said master portion to said slave portion of said register is controlled by the output clock signal.

9. The device of claim 5 wherein the phase detector includes:

a delay chain having a plurality of delay elements receiving the input clock signal, each delay element having an output producing a delayed signal corresponding to the input clock signal; and a sampling register having a plurality of register inputs and a clock input corrected to receive the output clock signal, each register input corresponding to one of the outputs of the delay elements, the sampling register further having a plurality of register outputs, each register output corresponding to one of the register inputs, for producing a digital signal representative of delay between the input dock signal and the output clock signal.

10. The device of claim 9 wherein the phase detector further includes a:

second sampling register having a plurality of register inputs and a clock input connected to receive the input clock signal each register input of the second sampling register corresponding to one of the outputs of the delay elements, the second sampling register further having a plurality of register outputs, each register output of the second sampling register corresponding to one of the outputs of the delay elements, for producing a digital signal representative of the period of the input clock signal; and a processor connected to receive the digital signal representative of the delay between the input clock signal and the output clock signal and to receive the digital signal representative of the periods of the input clock signal, the processor producing the digital signal indicative of the interpolation coefficient in response to the digital signals from the sampling registers.

11. The device of claim 9 wherein the sampling register includes a master storage portion and a slave storage portion and wherein transfers of data from the master portion to the slave portion are responsive to the output clock signal.

12. The device of claim 11 further including a stable data monitor connected to the sampling register for inhibiting the transfer of data between the master portion and the slave portion when data in the master portion is not in a stable state.

13. A method of converting a data signal at a first sampling frequency corresponding to an input clock signal to a data signal having substantially the same content at a lower, second sampling frequency corresponding to an output clock signal, comprising the steps of:

storing data from the data signal at the first sampling frequency in a first data register at an input sampling frequency;

determining an instantaneous phase relationship between the input clock signal and the output clock signal:

generating an interpolation coefficient in response to the determined instantaneous phase relationship for weighting the values of the stored data;

transferring said data from said first data register to a second data register;

outputting said data from said second data register at a selected output frequency different than the input frequency;

inputting the interpolation coefficient to an interpolation filter and obtaining a weighted data output signal determined in part by;

interpolating the data from the data signal stored in the second data register in response to the determined interpolation coefficient; and after generating the interpolation coefficient, comparing the interpolation coefficient to a previously generated interpolation coefficient; and if the interpolation coefficient and the previously generated interpolation coefficient are equal, inhibiting the transfer of data from the first register to the second register.

14. The method of claim 13 wherein said interpolation is a weighted mean of sequential data samples.

15. The method of claim 13 wherein said transfer of signal data from said first register to said second register is enabled by the input clock signal.

16. The method of claim 13 wherein the step of interpolating the data comprises the step of performing a spline interpolation.

17. The method of claim 13 wherein the step of determining the instantaneous phase relationship comprises the steps of:

determining for the input clock signal a clock period;

determining a temporal delay between a reference point in the input clock signal and a point in reference corresponding to the output clock signal; and comparing the temporal delay to the clock period.

18. The method of claim 17 wherein the reference point in the input clock signal and the corresponding reference point in the output clock signal are rising edges of clock pulses.

* * * * *

UNITED STATES PATENT AND TRADEMARK OFFICE
CERTIFICATE OF CORRECTION

PATENT NO. : 5,585,794
DATED : December 17, 1996
INVENTOR(S) : Fabrizio Airoldi, et. al.

It is certified that error appears in the above-identified patent and that said Letters Patent is hereby corrected as shown below:

In column 14, claim 1, line 16, following "output," please delete "dock," and insert --clock--.

In column 15, claim 9, line 14, following "input," please delete "dock," and insert --clock.--

Signed and Sealed this

Sixteenth Day of December, 1997

Attest:

BRUCE LEHMAN

Attesting Officer

Commissioner of Patents and Trademarks